US012740057B2

(12) United States Patent
Kim

(10) Patent No.: US 12,740,057 B2
(45) Date of Patent: Sep. 15, 2026

(54) NONVOLATILE MEMORY UNIT CELL AND ARRAY ARCHITECTURE

(71) Applicant: ANAFLASH INC., Sunnyvale, CA (US)

(72) Inventor: Sihwan Kim, San Francisco, CA (US)

(73) Assignee: ANAFLASH INC., Sunnyvale, CA (US)

( * ) Notice: Subject to any disclaimer, the term of this patent is extended or adjusted under 35 U.S.C. 154(b) by 575 days.

(21) Appl. No.: 18/200,199

(22) Filed: May 22, 2023

(65) Prior Publication Data

US 2024/0397711 A1 Nov. 28, 2024

(51) Int. Cl.
*H10B 41/10* (2023.01)
*H10B 43/10* (2023.01)

(52) U.S. Cl.
CPC ............ *H10B 41/10* (2023.02); *H10B 43/10* (2023.02)

(58) Field of Classification Search
CPC ........ H10B 41/10; H10B 43/10; H10B 41/27; H10B 41/60; H10B 41/70; H10B 41/30; H10B 41/50; G11C 14/0018; G11C 11/4074; G11C 11/409; H10D 30/68; H10D 30/6891; H10W 20/42; H10W 20/435
See application file for complete search history.

(56) References Cited

U.S. PATENT DOCUMENTS

| | | | | |
|---|---|---|---|---|
| 5,301,150 A * | 4/1994 | Sullivan | H10B 69/00 | 365/185.26 |
| 5,844,300 A * | 12/1998 | Alavi | H10B 69/00 | 257/532 |
| 6,788,574 B1 * | 9/2004 | Han | G11C 16/0408 | 257/E27.103 |
| 7,633,115 B2 * | 12/2009 | Wang | H10B 41/30 | 257/318 |

(Continued)

*Primary Examiner* — Eduardo A Rodela

(57) ABSTRACT

A non-volatile memory cell structure is designed to enable high density logic-compatible embedded flash memory. The non-volatile memory device includes a substrate including a plurality of n-well, said n-well including a plurality of diffusion regions, said diffusion regions are separated from each other by one or more non-active regions of the substrate; and, a first unit cell comprising: a first memory unit including a first P-MOS transistor formed on a first n-well on the substrate; a second memory unit including a second P-MOS transistor formed on as second n-well on the substrate, wherein the first and second P-MOS transistors overlap at least partially with a second unit cell laterally adjacent to the first unit cell; a third memory unit consisting of three N-MOS transistors formed on the substrate and connected in series and arranged parallel to a width of the unit cell; a first connection line coupling a gate of one of the three N-MOS transistor to a gate of the first P-MOS transistor along a length of the unit cell; and a second connection line coupling a gate of the first P-MOS transistor to a gate of the second P-MOS transistor along the length of the unit cell, wherein the three N-MOS transistors in series consist of a first N-MOS transistor sharing an active region with a second (Continued)

N-MOS transistor, and the second N-MOS transistor sharing an active region with a third N-MOS transistor.

18 Claims, 22 Drawing Sheets

(56) References Cited

U.S. PATENT DOCUMENTS

| | | | | |
|---|---|---|---|---|
| 7,636,252 | B2 * | 12/2009 | Lee | G11C 16/3436 365/185.05 |
| 7,859,043 | B2 * | 12/2010 | Pikhay | H10B 41/60 257/314 |
| 8,345,488 | B2 * | 1/2013 | Haggag | G11C 16/0416 365/185.08 |
| 8,378,407 | B2 * | 2/2013 | Audzeyeu | H10B 69/00 257/E27.102 |
| 8,928,056 | B2 * | 1/2015 | Matsuo | H10B 41/30 257/296 |
| 9,048,137 | B2 * | 6/2015 | Wang | H10B 41/60 |
| 9,087,587 | B2 * | 7/2015 | Mikalo | H10D 62/115 |
| 2008/0225593 | A1 * | 9/2008 | Mitros | H10D 30/0411 257/E21.422 |
| 2016/0141031 | A1 * | 5/2016 | Manipatruni | H10N 70/00 711/103 |
| 2020/0194079 | A1 * | 6/2020 | Chen | G11C 16/14 |
| 2023/0118978 | A1 * | 4/2023 | Park | G11C 16/0433 365/185.05 |

* cited by examiner

【FIG. 1】
PRIOR ART
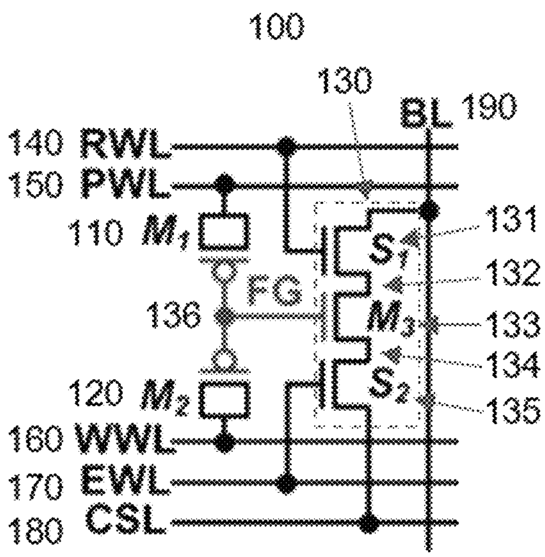

【FIG. 2A】
PRIOR ART
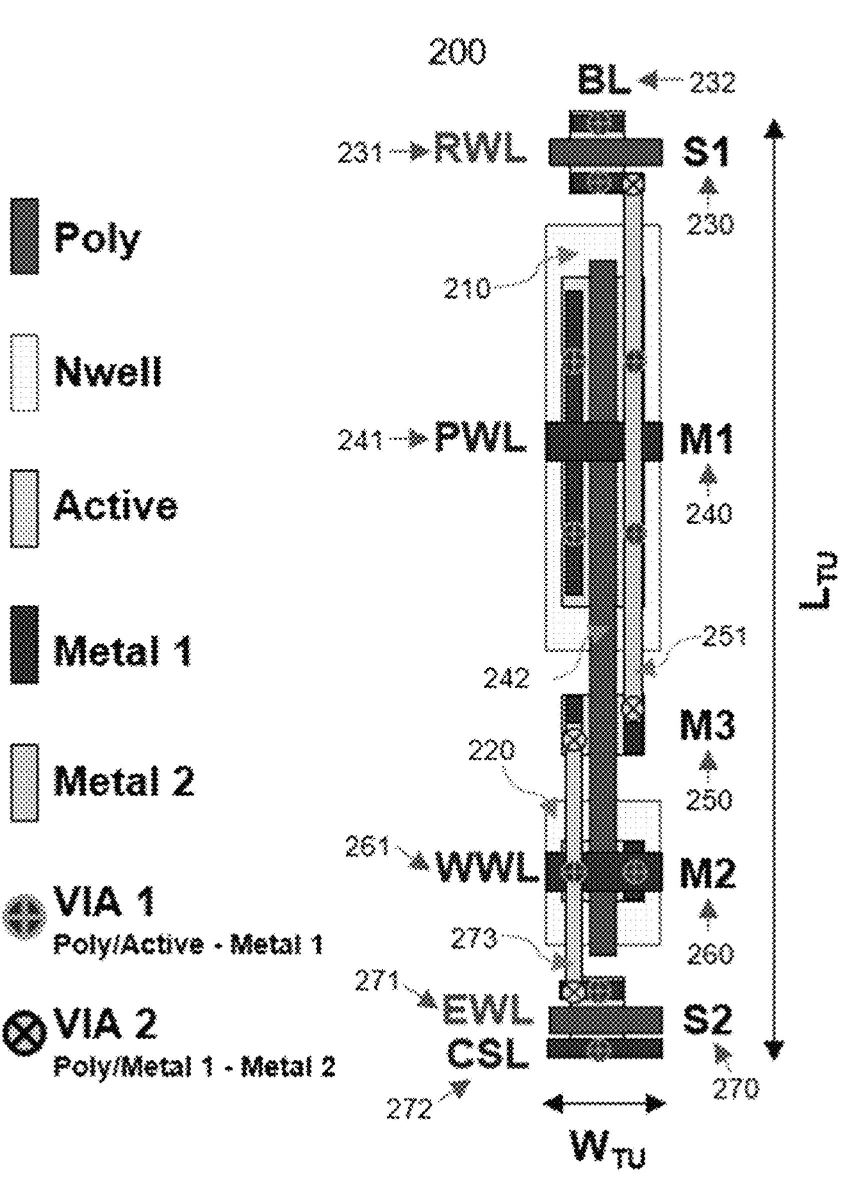

【FIG. 2B】
PRIOR ART
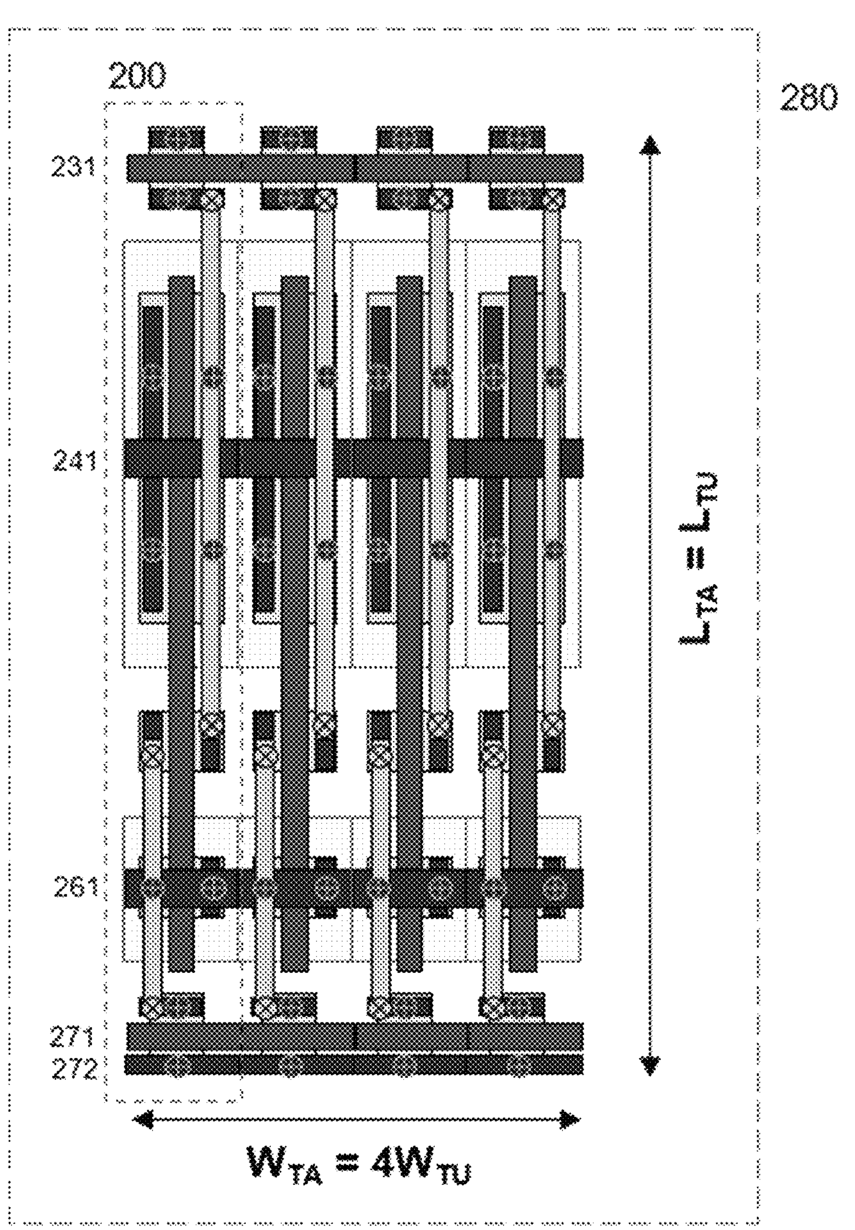

【FIG.3】
PRIOR ART
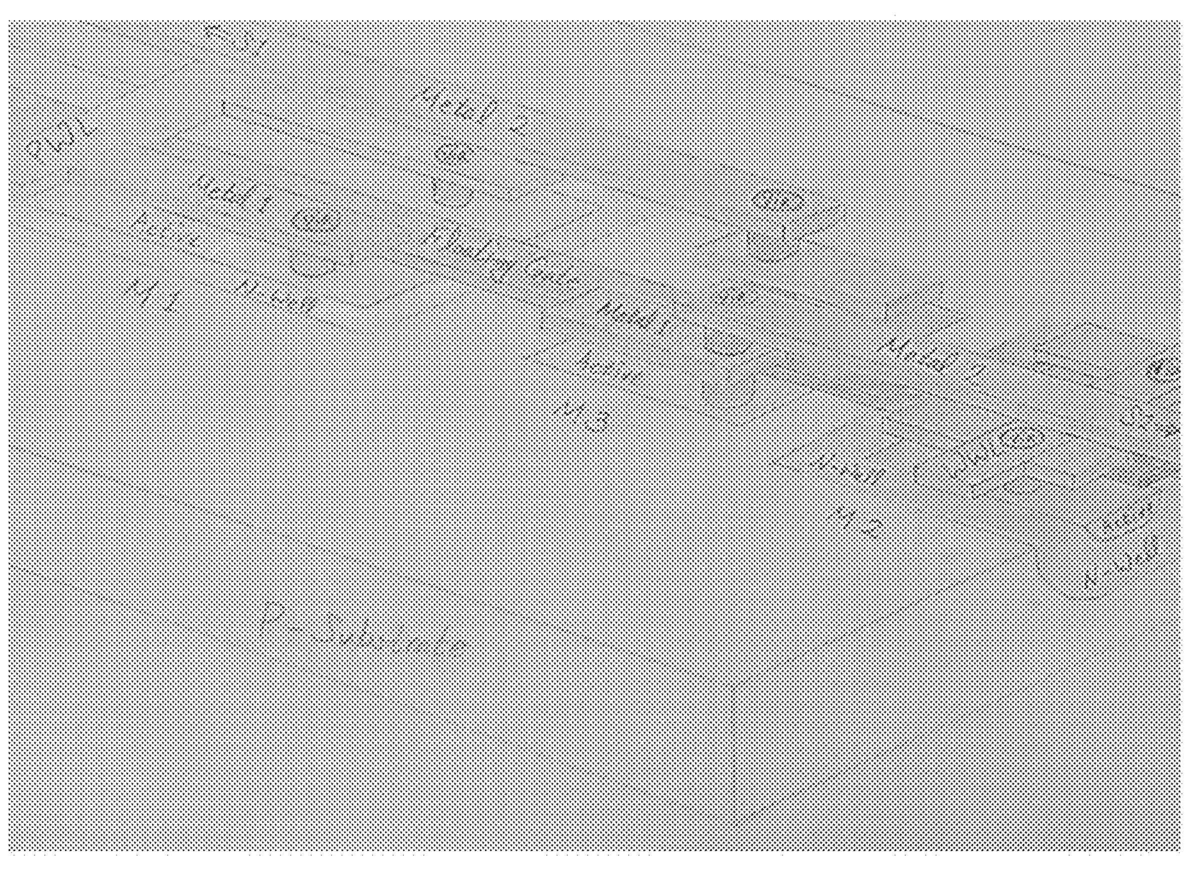

【FIG.4】
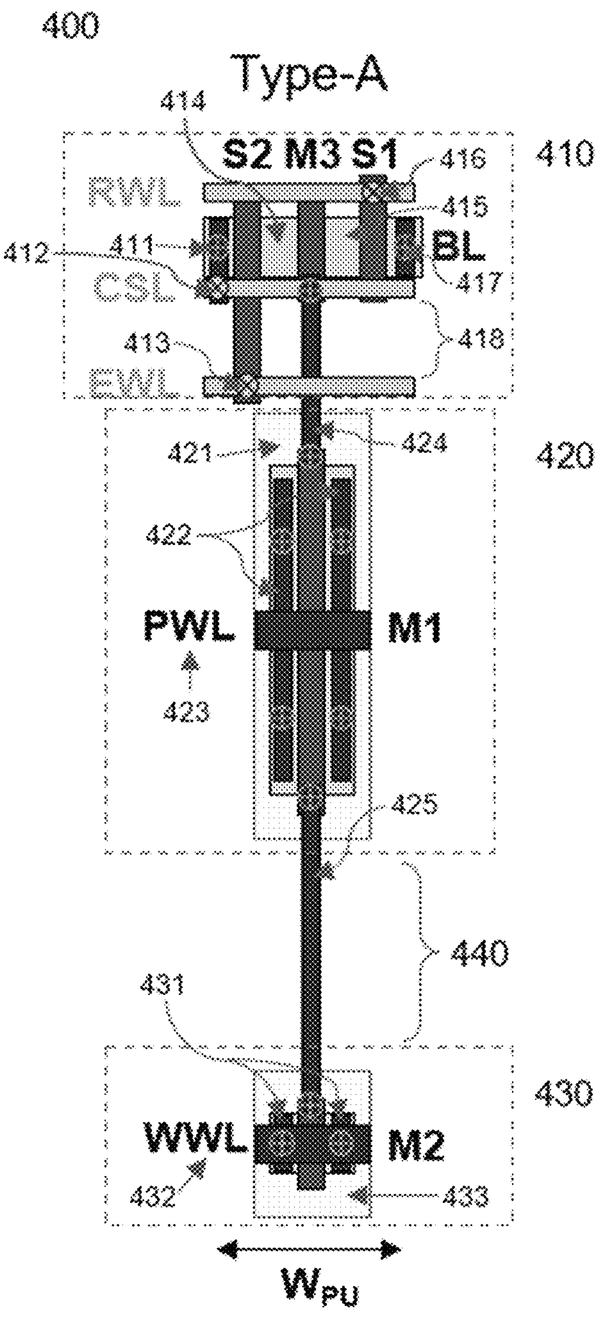

【FIG.5】
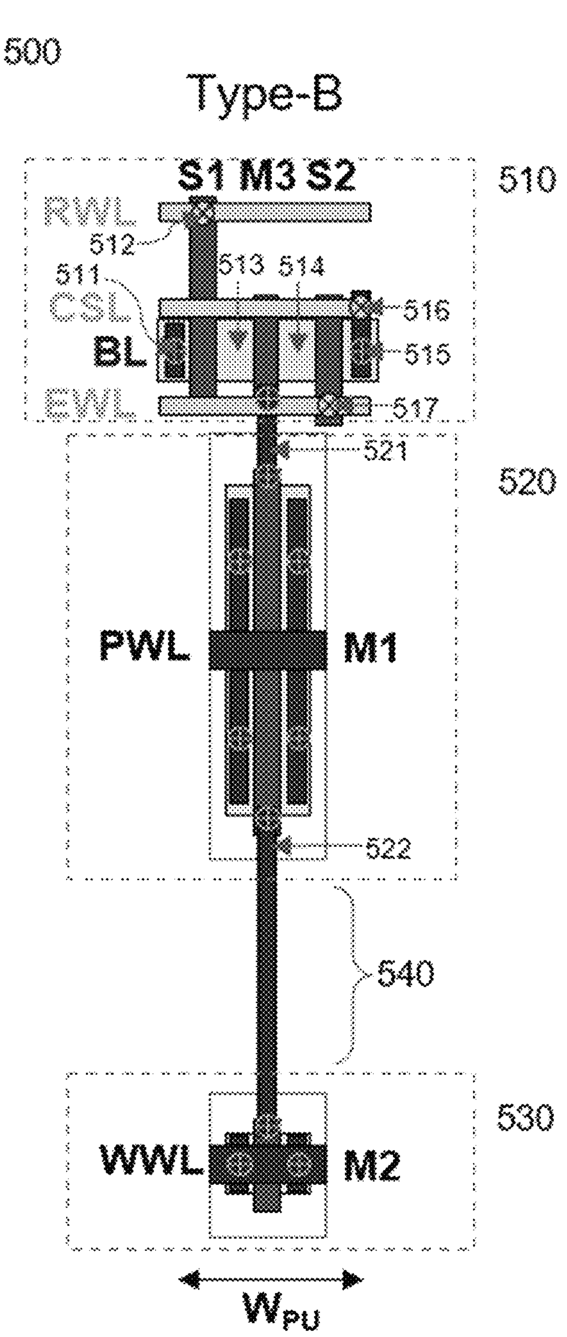

【FIG. 6】
600
Type-C
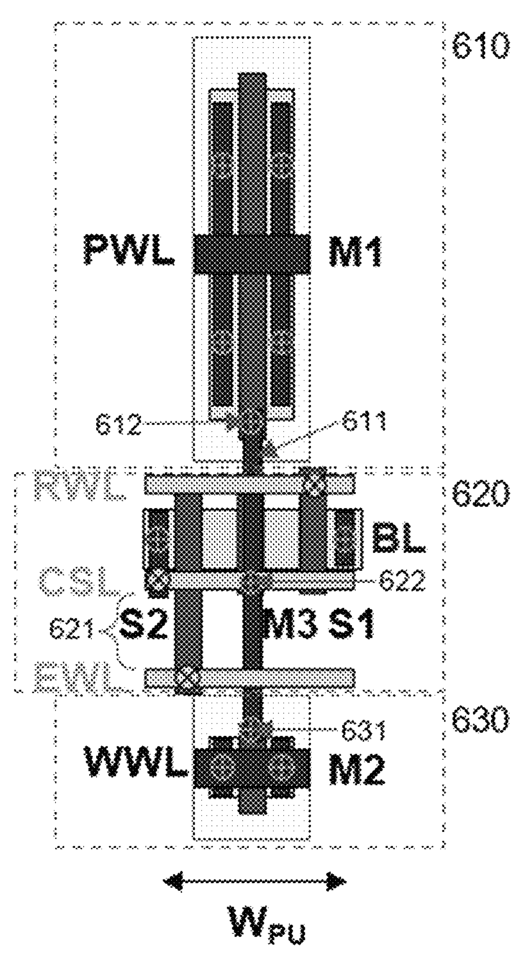

【FIG.7】
700
Type-D
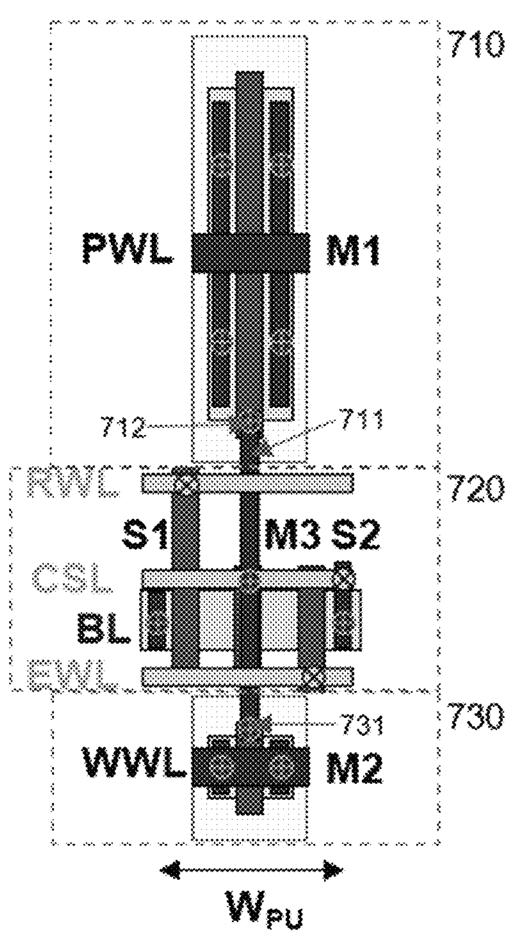

【FIG.8】
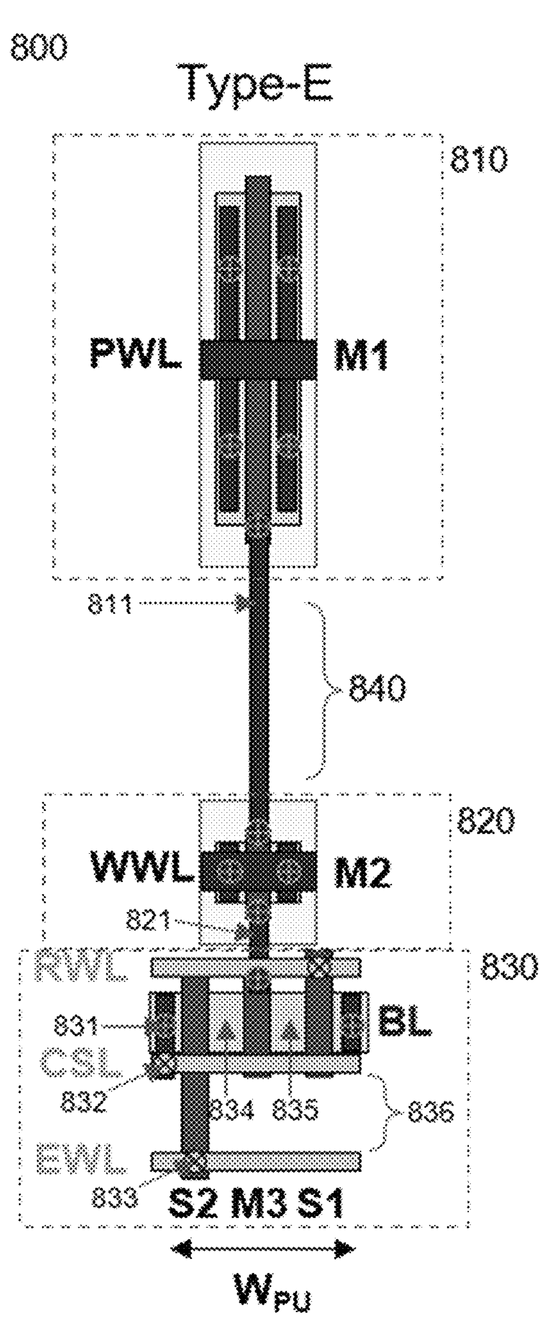

【FIG.9】
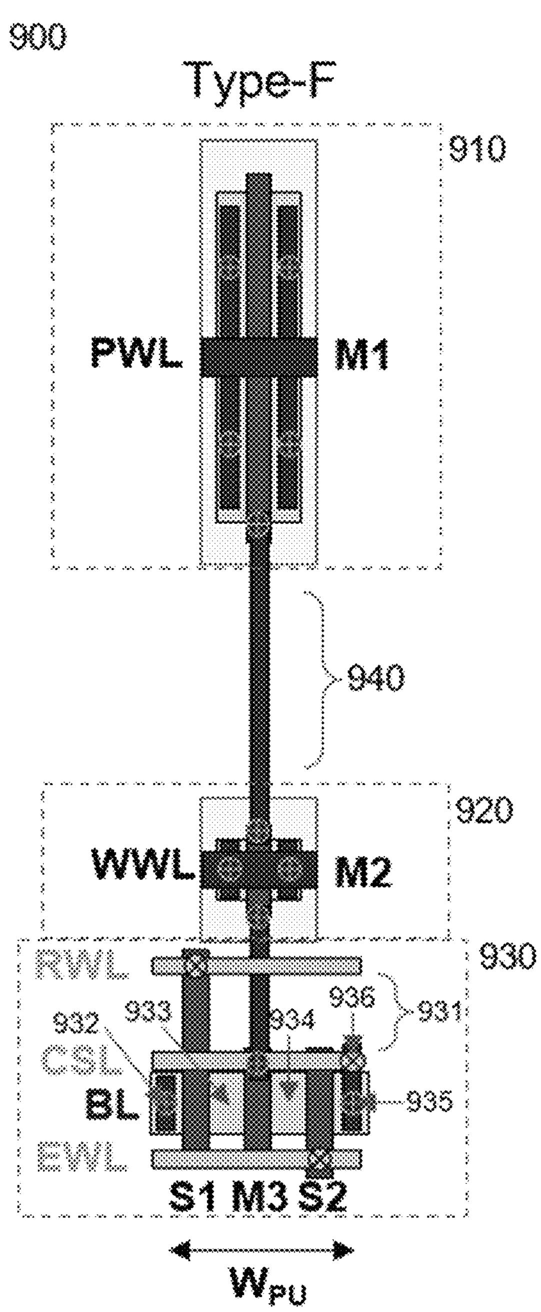

【FIG. 10】
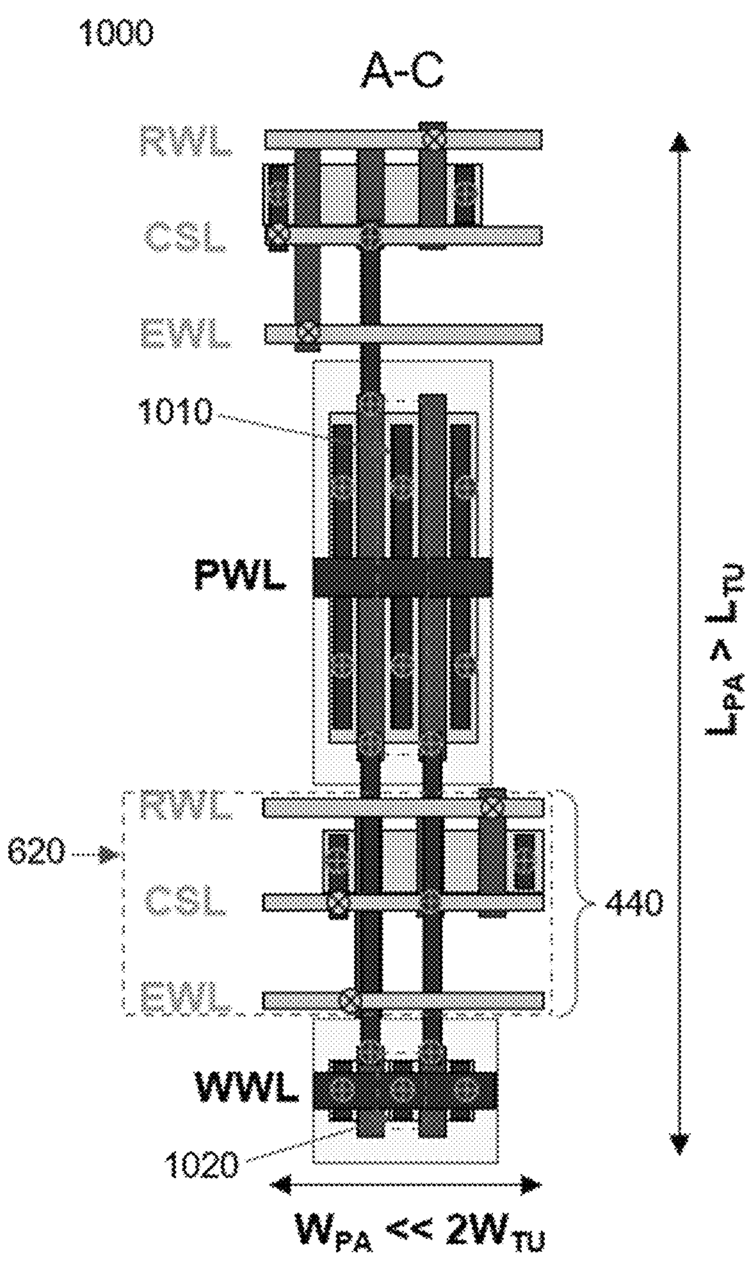

【FIG.11】
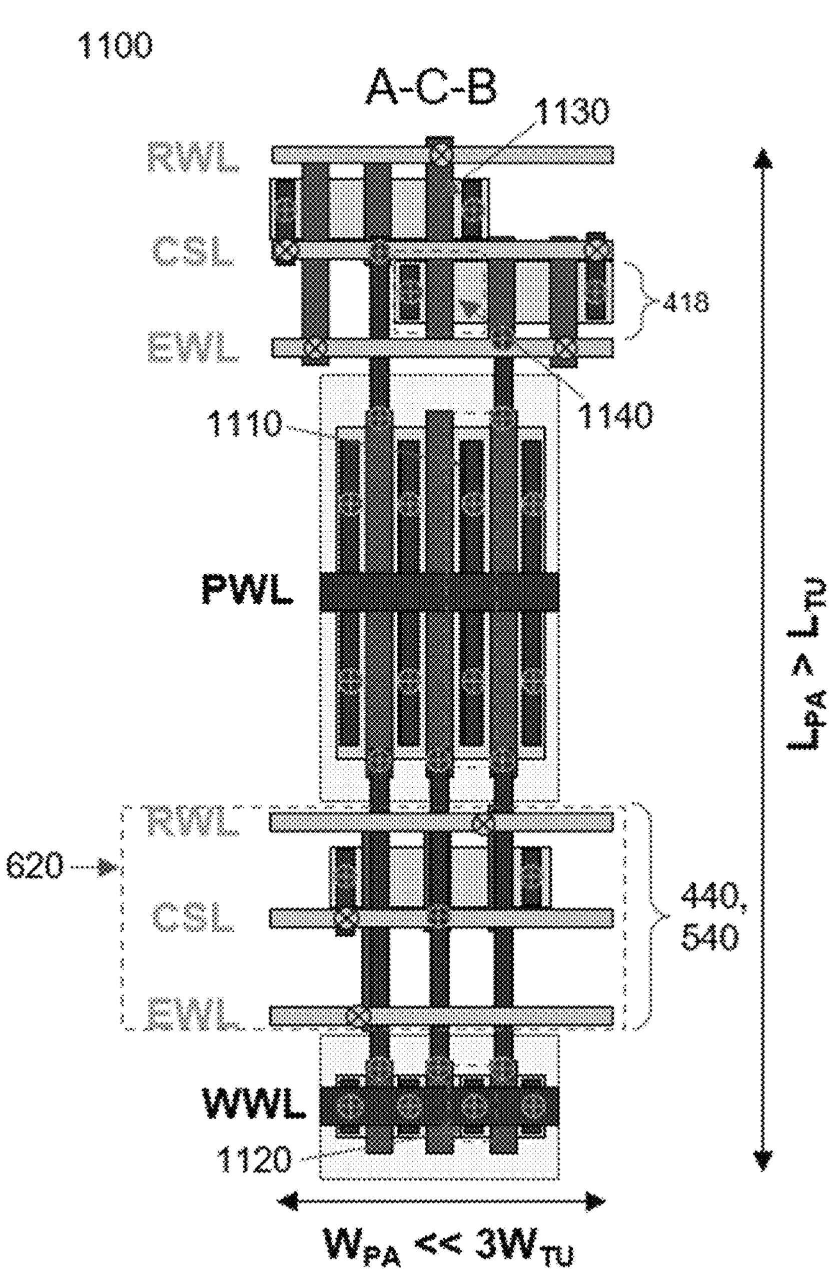

【FIG.12】
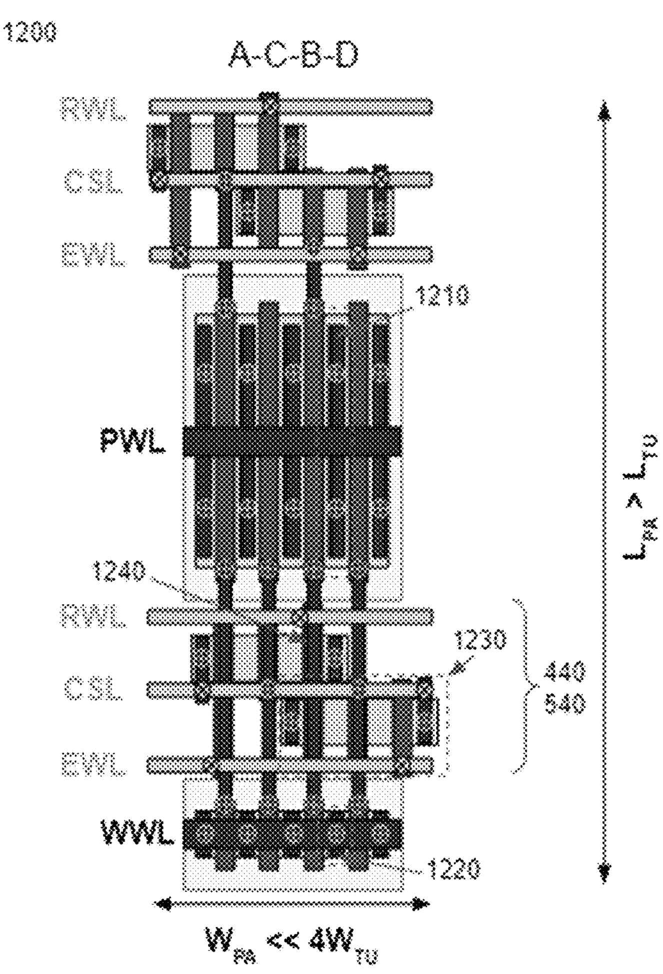

【FIG.13A】
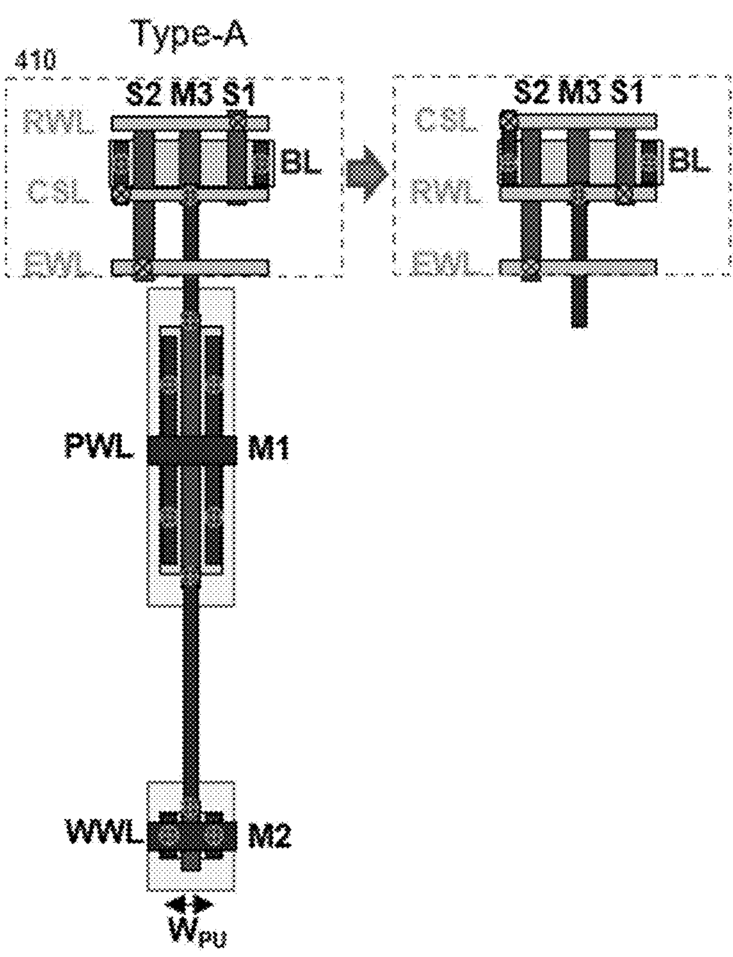

【FIG.13B】
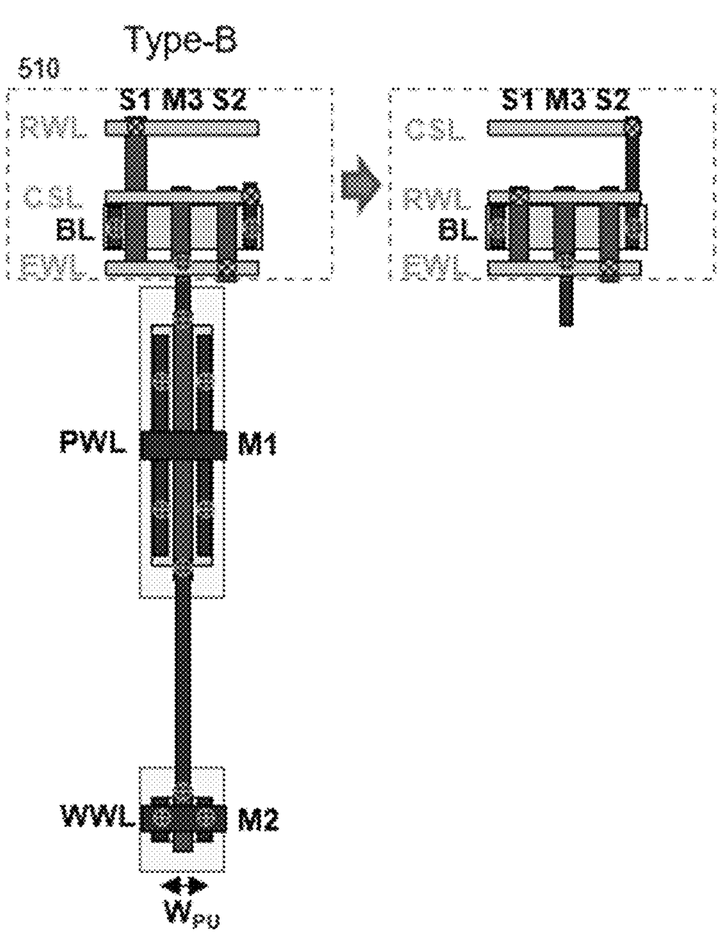

【FIG.14A】
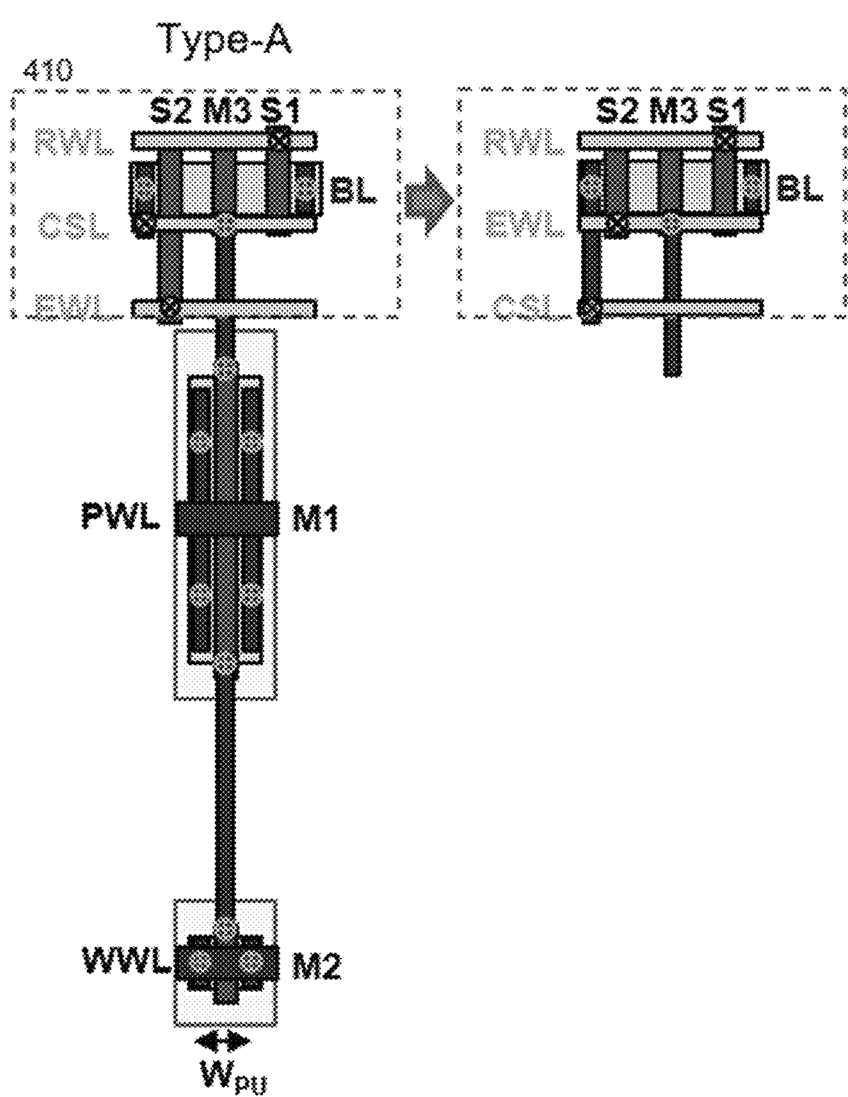

【FIG.14B】
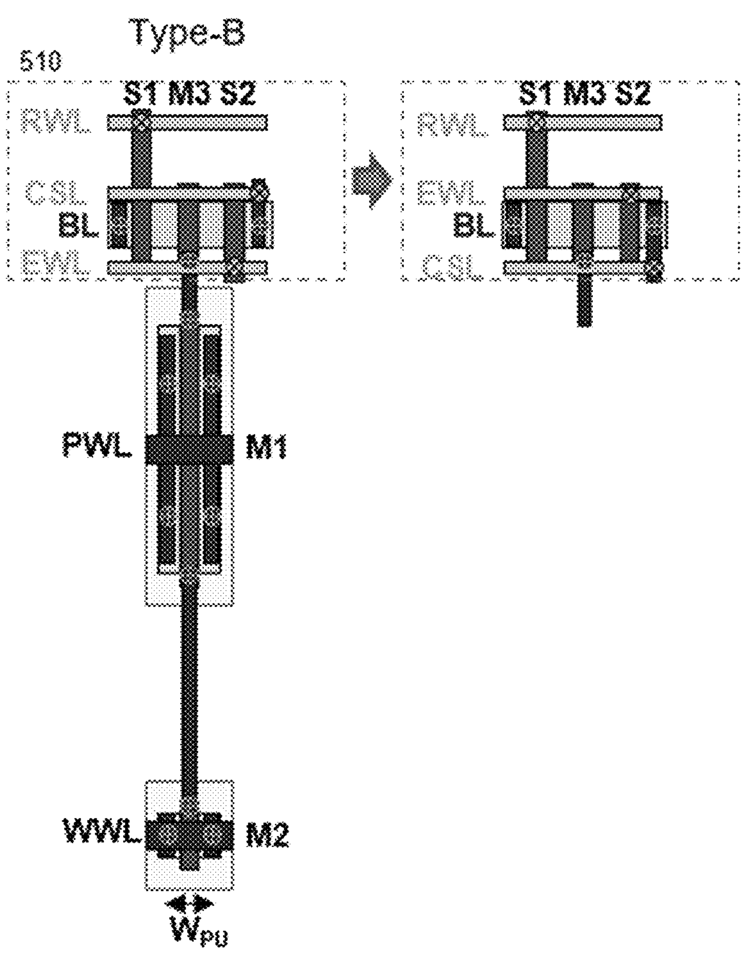

【FIG.15】
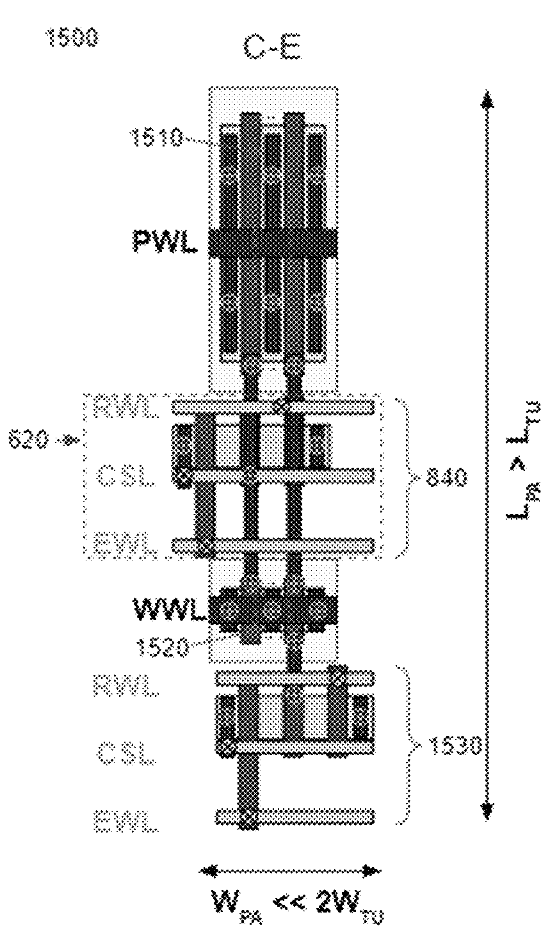

【FIG.16】
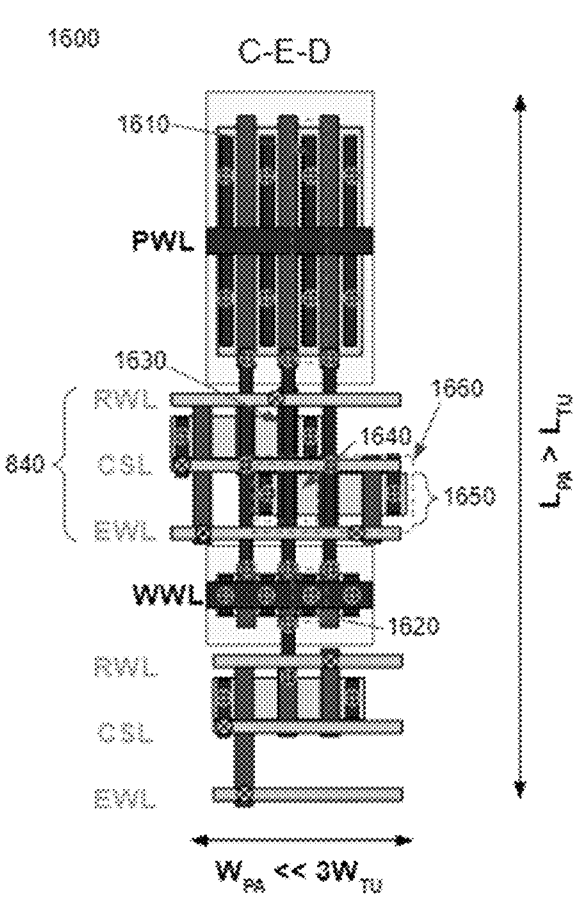

【FIG.17】
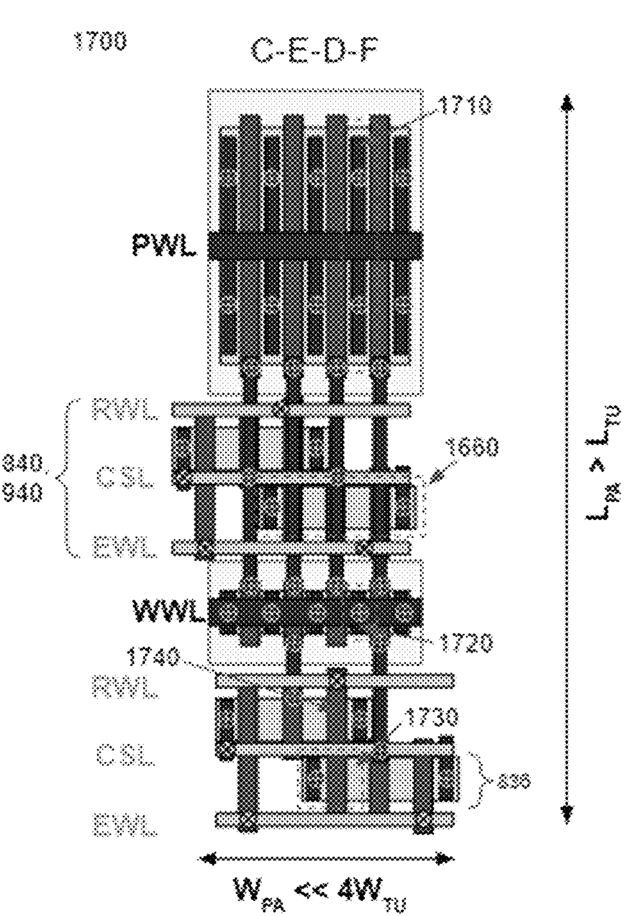

【FIG.18】
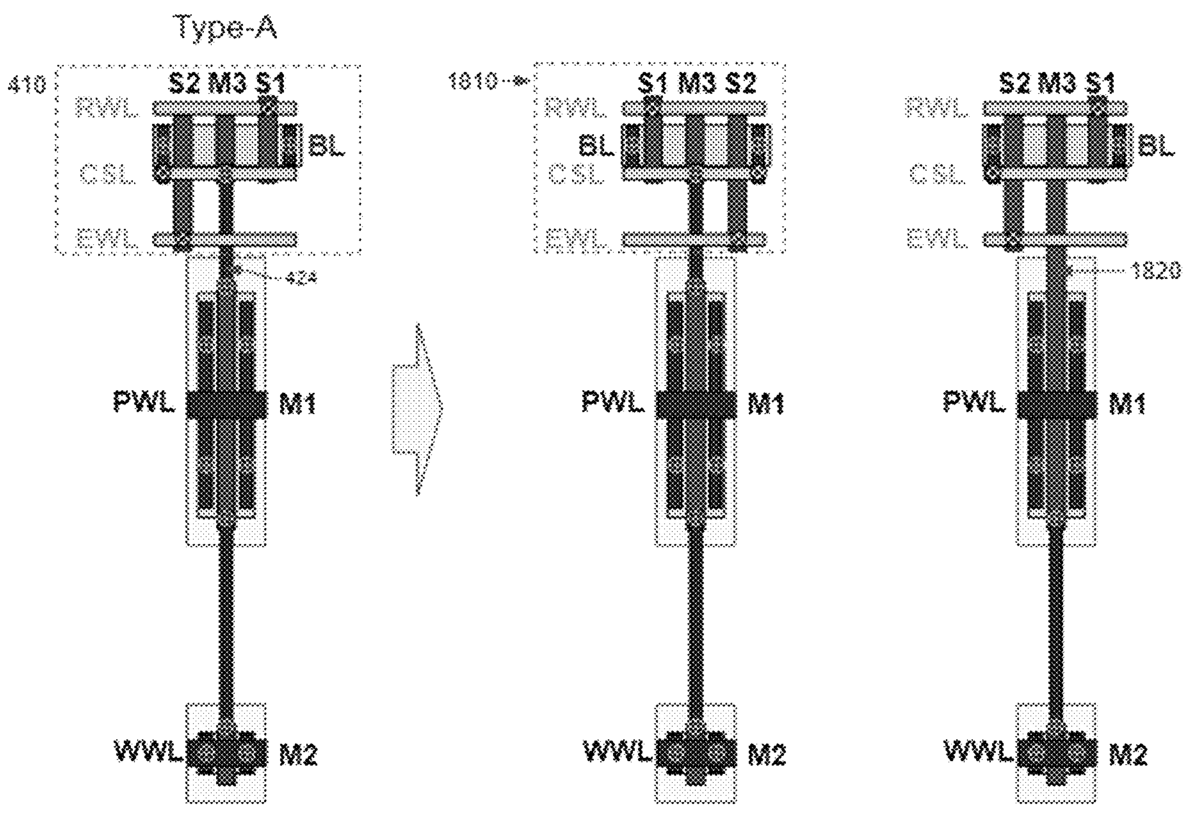

【FIG.19】
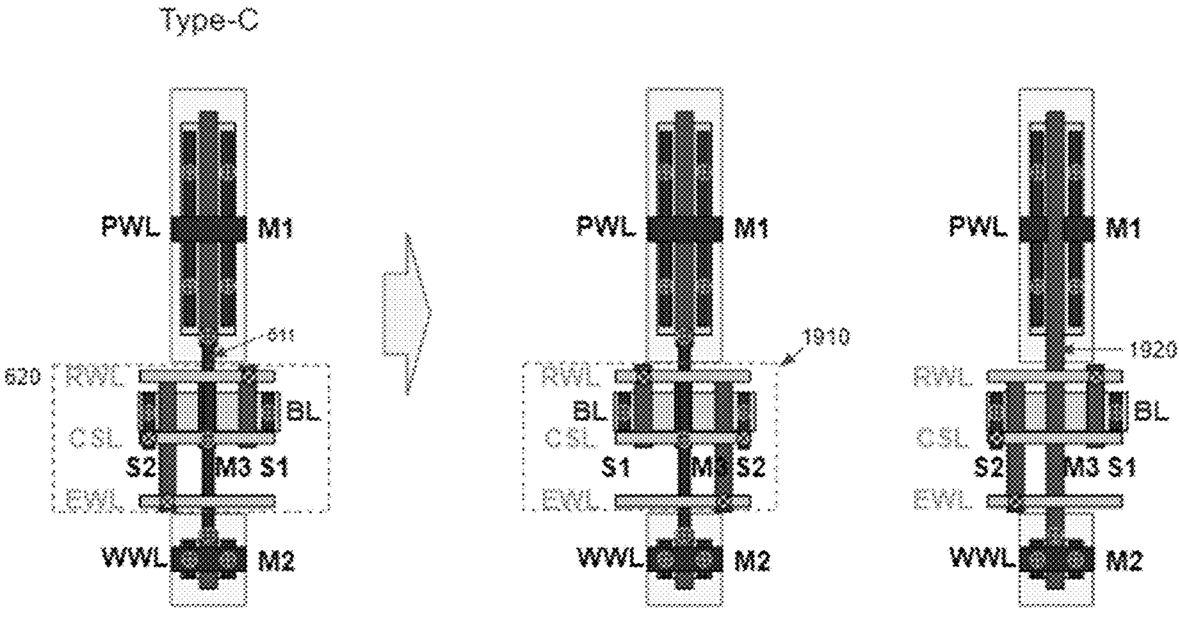

NONVOLATILE MEMORY UNIT CELL AND ARRAY ARCHITECTURE

CROSS-REFERENCE TO RELATED APPLICATION

This application is related to U.S. patent application Ser. No. 16/196,617, now U.S. Pat. No. 11,361,215. This invention generally relates to a cell array structure to enable high density logic-compatible embedded flash memory.

BACKGROUND OF THE INVENTION

1. Field of Invention

The present invention generally relates to memory devices and, in particular, to a unit memory cell architecture in a floating gate-based non-volatile memory (NVM).

2. Description of the Related Art

Rewritable embedded non-volatile memories (eNVM) such as flash, STT-MRAM, PRAM, and RRAM allow the system to completely shut down without losing data, resulting in zero-standby power dissipation and enabling ultra-low power systems such as wireless sensors and embedded microcontrollers. In many SoC applications, embedded Flash (eFlash) memories have been successfully deployed. However, they can only be found in foundries with dedicated eFlash processes. As a foundry-independent eFlash solution, multiple applications have proposed and used a logic-compatible embedded flash memory that uses no special devices other than standard core and I/O transistors. A high degree of integration of logic flash memory is technically desirable, as it can reduce chip production costs and allow the implementation of large AI models with large parameters.

FIG. 1 shows an example of an eNVM unit memory cell (100) that consists of a collection of MOS transistors connected by a group of word lines. The word lines are typically formed from metal or silicided/polycided polysilicon. This unit memory cell includes a coupling transistor M1 (110), a write transistor M2 (120), an upper select transistor S1 (131), a read transistor M3 (133), and a lower select transistor S2 (135). The transistors M1 (110) and M2 (120) share a floating gate node FG (136). M1 transistor (110) has drain and source terminals coupled to a program word line PWL (150), and it has a relatively larger capacity than that of M2 transistor (120) used for writing, erasing, and reading.

The floating gate node (136) is also connected to a control gate of the read transistor M3 (133). The read transistor M3 (133) connects transistors S1 (131) and S2 (135) in series. The drain terminal (132) of transistor M3 is coupled to a source terminal of transistor S1 in series. The transistor S1 has a drain terminal connected to a bit line BL (190) and a gate terminal connected to a read word line RWL (140). The transistor S2 has a drain terminal (134) that shares a common region with a source terminal of the transistor M3. A transistor S2 has a gate terminal coupled to an edge word line EWL (170) and a source terminal coupled to a common source line CSL (180).

Before writing or programming operation, erasing data stored in the memory cell (100) requires a large positive voltage to attract electrons trapped in the floating gate FG (136). By applying a high voltage to a write word line WWL (160) and grounding the other coupled lines RWL (140), a program word line PWL (150), EWL (170) and a common source line CSL (180), the high voltage HV on WWL (160) attracts the trapped electrons and removes them from the floating gate FG (136).

The unit memory cell (100) is programmed by applying high voltages to PWL (150) and WWL (160) lines, causing electrons to be injected into the floating gate (136) of the transistor M3 (133) to change its conductance. Consequently, the number of electrons trapped in the floating gate (136) changes the control gate voltage required to turn on the transistor M3 (133), creating a new threshold voltage VTH of the transistor M3. This particular threshold voltage represents the stored data value in the memory cell until it is changed by a reset. The memory cell reading involves measuring the change in current flow in output line BL (190) by observing the read transistor M3's response to a low input voltage applied (Vrd) on PWL (150) and WWL (160).

Therefore, there is a need for a floating gate-based non-volatile memory cell that achieves a more efficient spatial layout than the prior art, while maintaining the static characteristic of the floating gate-based nonvolatile memories. The following specification explains the present invention's solution to the above-mentioned problems. The memory cell structure described in this specification is required for high-density logic compatibility with embedded flash memory.

SUMMARY OF INVENTION

The present invention has been made in view of the above difficulties and problems. A primary objective of the present invention is to provide an efficient design for the array of unit memory cells. Non-volatile memory cells based on floating gates can be efficiently arranged on semiconductor substrates according to the following specification. The present invention describes various configurations of component transistors within each non-volatile memory cell on a semiconductor die, thereby reducing the overall die size.

A non-volatile memory cell structure is designed to enable high density logic-compatible embedded flash memory. In a general aspect, a non-volatile memory device comprises: a substrate including a plurality of n-well, said n-well including a plurality of diffusion regions, said diffusion regions are separated from each other by one or more non-active regions of the substrate; and, a first unit cell comprising: a first memory unit including a first P-MOS transistor formed on a first n-well on the substrate; a second memory unit including a second P-MOS transistor formed on as second n-well on the substrate, wherein the first and second P-MOS transistors overlap at least partially with a second unit cell laterally adjacent to the first unit cell; a third memory unit including three N-MOS transistors formed on the substrate and connected in series and arranged parallel to a length of the unit cell; and one or more connection lines couple a gate of one of the three N-MOS transistors and gates of the first and second P-MOS transistors, wherein the three N-MOS transistors in series consist of a first N-MOS transistor sharing an active region with a second N-MOS transistor, and the second N-MOS transistor sharing an active region with a third N-MOS transistor.

In another aspect, metal layers or polysilicon layers are used for the connection line.

In another aspect, the first P-MOS transistor has source and drain regions connected to a first word line parallel to a width of the first unit cell, whereas the second P-MOS transistor has source and drain regions connected to a second word line parallel to the width of the first unit cell, and each of the first and second word lines is either a program word line or a write word line.

In another aspect, the third memory unit further comprises (1) a group of first metal lines arranged parallel to the length of the first unit cell and (2) a group of second metal lines arranged parallel to the width of the first unit cell.

In another aspect, one of the group of first metal lines is connected to an active region at one end of the three transistors in series, while the other is connected to an active region at the opposite end of the three transistors.

In another aspect, the group of second metal lines include three parallel metal lines, which are separated at regular intervals, extending along a width of the first unit cell such that at least a portion of the three N-MOS transistors is positioned between a first and second one of the group of second metal lines, whereas a third unit cell has three N-MOS transistors positioned in an interval between the second and third one of the group of second metal lines.

In another aspect, each of the N-MOS and P-MOS transistors has a gate region that is connected to a polysilicon layer.

In another aspect, one of the N-MOS transistors has a gate region with polysilicon layer connected through a metal line or a polysilicon layer to the gate region of the first P-MOS transistor and the gate region of the second P-MOS transistor.

In another aspect, the first unit cell has a space between the first memory unit and the second memory unit, which is long enough to accommodate a memory unit of the second unit cell laterally adjacent to the first unit cell or long enough to accommodate the third memory unit of its own cell.

In another aspect, the second unit cell comprises three memory units, including the same first and second P-MOS transistors as the first unit cell.

In another aspect, a distance between the first and second P-MOS transistors in the second unit cell is equal to the distance between the first and second P-MOS transistors in the first unit cell such that common active regions are formed when active regions of the first and second PMOS transistors in the first unit cell, which are adjacent to the second unit cell, are combined with active regions of first and second PMOS transistors in the second unit cell, which are adjacent to the first unit cell.

In another aspect, the second unit cell includes a third memory unit, which comprises three N-MOS transistors having a similar structure as the first unit cell.

In another aspect, the third memory unit in the second unit cell has the same size with the third memory unit of the first unit cell.

In another aspect, the third memory unit of the first unit cell is combined to a third memory unit of the third unit cell, wherein the third unit cell overlaps at least partially with the second unit cell and a fourth unit cell laterally adjacent to the third unit cell on an opposite side from where the second unit cell is located.

In another aspect, the third unit cell includes three memory units, including first and second memory units that are identical to the first and second memory units of the first unit cell and a third memory unit with a mirrored arrangement of the N-MOS transistors in the first unit cell.

In another aspect, the third unit cell further includes (1) a group of first metal lines arranged parallel to the length of the unit cell with the same structure as the group of first metal lines of the first unit cell and (2) a group of second metal lines arranged parallel to the width of the unit cell with intervals identical to the intervals of the group of second metal lines of the first unit cell.

In another aspect, a distance between the first and second memory units in the third unit cell is equal to the distance between the first and second memory units of the first unit cell.

In another aspect, the fourth unit cell includes first and second memory units identical to the first and second memory units in the second unit cell.

In another aspect, the third memory unit includes (1) a group of first metal lines arranged parallel to the length of the unit cell with the same structure as the group of first metal lines of the second unit cell and (2) a group of second metal lines arranged parallel to the width of the unit cell with intervals identical to the intervals of the group of second metal lines of the second unit cell.

In another aspect, the third memory unit is configured with a mirrored arrangement of the N-MOS transistors in the second unit cell, wherein the third memory unit of the second unit cell is combined to a third memory unit of the fourth unit cell.

BRIEF DESCRIPTION OF THE DRAWINGS

The following drawing parts of the specification are included to further demonstrate certain embodiments or various aspects of the invention. In some instances, embodiments of the invention can be best understood by referring to the accompanying drawings in combination with the detailed description presented herein. The description and accompanying drawings may highlight a certain specific example, or a certain aspect of the invention. However, one skilled in the art will understand that portions of the example or aspect may be used in combination with 5 other examples or aspects of the invention.

FIG. 1 is a schematic circuit diagram of an individual memory cell in a non-volatile memory device.

FIG. 2A shows a traditional unit cell structure corresponding to the memory cell of FIG. 1.

FIG. 2B is a plan view of a traditional cell array consisting of four-unit cells of FIG. 2A.

FIG. 3 shows a three-dimensional layout structure of transistors forming the unit memory cell in FIG. 1.

FIG. 4 shows a first layout structure of the individual non-volatile memory cell in FIG. 1 according to one embodiment of the present invention.

FIG. 5 shows a second layout structure of the individual non-volatile memory cell in FIG. 1 according to one embodiment of the present invention.

FIG. 6 shows a third layout structure of the individual non-volatile memory cell in FIG. 1 according to one embodiment of the present invention.

FIG. 7 shows a fourth layout structure of the individual non-volatile memory cell in FIG. 1 according to one embodiment of the present invention.

FIG. 8 is an illustration showing a fifth layout structure of the individual non-volatile memory cell in FIG. 1 according to one embodiment of the present invention.

FIG. 9 is an illustration showing a sixth layout structure of the individual non-volatile memory cell in FIG. 1 according to one embodiment of the present invention.

FIG. 10 shows a first unit cell array according to one embodiment of the present invention.

FIG. 11 shows a second unit cell array according to one embodiment of the present invention.

FIG. 12 shows a third unit cell array according to one embodiment of the present invention.

FIG. 13A and FIG. 13B show embodiments of a unit cell similar to the unit cell shown in FIG. 4 and FIG. 5, respectively.

FIG. 14A and FIG. 14B show embodiments of a unit cell similar to the unit cell shown in FIG. 4 and FIG. 5, respectively.

FIG. 15 shows a fourth unit cell array according to one embodiment of the present invention.

FIG. 16 shows a fifth unit cell array according to one embodiment of the present invention.

FIG. 17 shows a sixth unit cell array according to one embodiment of the present invention.

FIG. 18 shows exemplary layout structures equivalent to the first layout structure in FIG. 4, in accordance with one embodiment of the present invention.

FIG. 19 shows exemplary layout structures equivalent to the third layout structure in FIG. 6, in accordance with one embodiment of the present invention.

DETAILED DESCRIPTION OF THE INVENTION

FIG. 2A shows the traditional layout of the memory unit cell in FIG. 1. In FIG. 2A, "poly" refers to a polysilicon layer. "Nwell" refers to a N-well formed on a substrate (not shown). "Active" refers to a diffusion region, and a plurality of diffusion regions are separated from one another by one or more non-active regions. "Metal 1" refers to the first metal layer, and "Metal 2" refers to the second metal layer. The first metal and second metal layers can be the same or different metal components, and the difference between them can be understood as having different levels on the chip of semiconductor devices. Vias are formed in semiconductor devices, for example, in order to electrically interconnect two layers of metallization. "VIA 1" refers to the via that connects (1) a polysilicon layer to a metal 1 layer or (2) an active region on a n-well to a metal 1 layer. "VIA 2" refers to the via connecting (1) the polysilicon layer to the metal 2 layer or (2) the metal 1 layer to the metal 2 layer. It is important that the active region must, however, be connected to VIA 1 prior to the metal 2 layer being created, as Metal 2 is not created until VIA 1 is in place. Similarly, if there is a semiconductor that requires a direct connection to the metal 3 layer in the active region, it will be connected as follows: active region-via 1-via 2-via 3-metal 3.

In a memory unit cell (200), the gate regions of M1 transistor (240), M2 transistor (260), and M3 transistor (250) are connected back-to-back on a p-type substrate (not shown) to form the floating gate (FG) (242) node. S1 transistor (230) has active source and drain regions (e.g., N-type doping regions) on the p-type substrate and a gate that defines a channel between the active source and drain regions. Activated regions are parallel to RWL (231). A pair of Metal 1 layers (in blue) are connected to the drain and source regions of S1 transistor by VIA 1, respectively, along the width (Wtu) of the memory unit cell. In particular, Metal 1 has two layers, one of which is connected to the BL line (232) and the other of which is coupled to Metal 2 via VIA 2.

Metal 2 layer (251) is connected to S1 (230) and M3 (250) transistors by VIA 2 (i.e., the source region of S1 transistor to M3 transistor's drain region), passing through M1 (240) transistor. A polysilicon layer (shown in red) is coupled to the gate region of S1 transistor and extended to RWL (231) line along the width (Wtu) of the memory unit cell (200).

In a first N-well (210) on the p-type substrate, M1 transistor (240) has active drain and source regions (i.e., P-type doping regions) as well as a gate region that defines a channel between the drain and source regions. Polysilicon layer (242) covering the gate region (in red) is located above the gate region. Metal layer 1 (blue) covering the active drain and source regions of the M1 transistor extends to PWL (241) line layer.

On the p-type substrate, M3 transistor (250) has active drain and source regions (i.e., N-type doping regions) and a gate region defining a channel between the drain and source regions. Polysilicon (242) covering M1 transistor extends to M3 transistor's gate region. A pair of Metal 1 layers (in blue) are parallel to the polysilicon layer and cover the drain and source regions of M3 transistor, respectively. M3 transistors have two active regions, one of which is connected to one active region of S1 transistor by Metal 2 layer (251) passing through M1 transistor, and the other to one active region of S2 transistor (270) by another Metal 2 layer (273) passing through M2 transistor.

In a second N-well (220) on the p-type substrate, M2 transistor (260) has active drain and source regions (i.e., P-type doped regions) and a gate region defining a channel interposed between the drain and source regions. The polysilicon layer (in red, 242) covering M1 and M3 transistors extends to cover the gate region of M2 transistor. There are two Metal 1 layers (in blue) parallel to the polysilicon layer, extending to the WWL (261) input line, and covering the M2 transistor drain and source regions.

On the p-type substrate, S2 transistor (270) has active drain and source regions (i.e., N-type doping regions) and a gate region defining a channel interposed between the drain and source regions. The active regions are placed in parallel to EWL (271) and CSL (272) lines. A pair of Metal 1 layers (in blue) are connected to the drain and source regions of transistor S2 by VIA 1, respectively, along the width (Wtu) of the memory unit cell. One of the Metal 1 extends to CSL (272) line, the other of Metal 1 is coupled to Metal 2 layer (273) by Via 2. Metal 2 layer (273) is connected to M3 transistor by VIA 2, passing through the M2 transistor. A polysilicon layer is coupled to the gate region of transistor S2 and extended to EWL (271) line along the width (Wtu) of the memory unit cell.

FIG. 2B shows a plan view of four-unit cells (280) arranged in a word line direction WL. In the cell array, the width (Wta) is up to four times that of a unit cell (Wtu), and the length (Lta) matches the size of the unit cell (Ltu). Across the width of the unit cell direction, the four-unit cells are arranged in the array in such a manner that they share the read word line RWL (231), the programming word line PWL (241), the write word line WWL (261), and the edge word line EWL (272). Unit cell width (Wtu) is set by the minimum space rule between active layers of two neighboring transistors in the word line direction WL.

FIG. 3 shows a perspective view of a part of the individual memory cell (i.e., M1, M3, and M2 transistors) layout in FIG. 2A. Metal layers are located above the diffusion contact layer (active source and drain regions) and the gate electrode contact layer (polyoxide region). The metal layers include a first metal (Metal 1) layer, a first via (VIA 1), a second metal (Metal 2) layer, and a second via (VIA 2). Metal layers and vias can define the desired circuit connectivity. The logic function of the circuitry is achieved by connecting diffusion contacts and gate electrode contacts in the memory cell via metal layers and vias. Metal layers and vias are not limited to a specific number of interconnect layers in the dynamic array architecture. An embodiment of the dynamic array may include additional interconnect layers beyond the second metal layer (metal 2). Alternatively, in another embodiment, the dynamic array may include more than two metal layers.

FIG. 4 through FIG. 9 illustrate different unit cell structures (Type A through Type F unit cells) for a nonvolatile memory device according to the present invention. In the examples, Type A can be paired with Type B, Type C with Type D, and Type E with Type F.

In spite of their varied structures, the unit cells have certain technical features in common. Every unit cell, for example, has three subgroups, one with N-MOS transistors (S1, M3, and S2) and the other two with P-MOS transistors (M1 or M2). In the unit cell, each transistor has active regions (drain and source regions), some of which are connected to a metal layer while others lie around without any connection. The gates of all transistors are covered by polysilicon gate layers. Furthermore, the polysilicon gate layer over one transistor is either (1) connected to the polysilicon gate layer over the other transistor via Metal 1 layer or (2) connected to Metal 2.

M1 and M2 transistors are separated by the same distance for each unit cell. The gap between M1 and M2 is either occupied by S1, M3, and S2 transistors of the own unit cell (Types C and D) or it is left as free space (Type A, B, E, and F) and becomes filled when combined with other unit cells. The input lines (RWL, CSL, and EWL) connected to the unit cell are separated while maintaining the same position and distance regardless of the layout type. In this way, unit cells of different layout types but with the same space for S1, M3, and S2 transistors can be combined without coordinating input lines. Furthermore, regardless of the type of unit cell, the space occupied by input lines (RWL, CSL, and EWL) is sufficient to fill the space between M1 and M2 transistors.

It also should be noted that the positions of the M1 transistor and the M2 transistor can be exchanged based on technical necessity, but the space (distance) between them remains constant regardless of the positional changes. Type A through F can be modified from the presented herein. Furthermore, diverse metal layers can be used for connecting subgroups of the unit cell, e.g., Metal 2, Metal 3, or Metal 4, etc., depending on architectural requirements. Furthermore, polysilicon or diverse metal layers can be used to connect the first and second groups. Diverse metal layers can be used to connect the second and third groups.

FIG. 4 shows Type A unit cell structure on an integrated circuit according to a first embodiment of the present invention. Type A unit cell (400) consists of three subgroups. The first subgroup (410) includes S2, M3, and S1 transistors; the second subgroup (420) includes M1 transistor; and, the third subgroup (430) includes M2 transistor.

In the first subgroup (410), S2, M3, and S1 transistors are positioned between RWL and CSL line layers. S2, M3, and S1 transistors are formed on a p-type substrate containing four n-type active regions (shown in gray color). Across the length of the unit cell, polysilicon gate layers are arranged in parallel on the gate regions of S2, M3, and S1 transistors. A source region of the S2 transistor is coupled to Metal 1 (shown in blue color) by VIA 1 (411), and the coupled Metal 1 is connected to CSL line layer (Metal 2) by VIA 2 (412). The polysilicon gate layer (shown in red color) on S2 transistor extends through CSL layer and is coupled to EWL layer (Metal 2) by VIA 1 (not shown) and VIA 2 (413).

A drain region of S2 transistor shares a first common active region (a common diffusion region, 414) with a source region of M3 transistor. In M3 transistor, the gate region is connected to a polysilicon gate layer. The drain region of M3 transistor shares a second common active region (a common diffusion region, 415) with a source region of the S1 transistor. S1 transistor has a gate region covered by a polysilicon gate layer connected to RWL line layer by VIA 1 (not shown) and VIA 2 (416), and a drain region connected to the bit line (BL) by Via 1 (417). Both CSL and EWL line layers are parallel to the width of the unit cell and no transistors are arranged between CSL and EWL line layers. The space (418) between the CSL and EWL line layers is designed to accommodate the S1, M3, and S2 transistors of the type B unit cell when two types of unit cells (types A and B) are combined.

In the second subgroup (420), M1 transistor is formed with two p-type diffusion regions in a n-well (421) on the p-type substrate. Also, there is a gate region separating the p-type diffusion regions of M1 transistor. A polysilicon layer coupling to the gate region is positioned on the gate region. In parallel with the polysilicon layer, Metal 1 layers (422) are coupled to the drain and source regions of M1 transistor, respectively, and extend to PWL (423) line layer. Metal 1 layer (424) connects M3 transistor to M1 transistor. Specifically, Metal 1 layer (424) couples the polysilicon gate layer of M3 transistor to the polysilicon gate layer of M1 transistor. Another Metal 1 layer (425) connects M1 and M2 transistors. Specifically, Metal 1 layer (425) couples the polysilicon gate layer of M1 transistor to a polysilicon gate layer coupled to a gate region of M2 transistor.

In the third subgroup (430), M2 transistor has two p-type diffusion regions in a n-well (433) separated by the gate region defining a channel between the drain and source regions. The gate region is covered with a polysilicon gate layer positioned above the gate region. A pair of Metal 1 layers (in blue, 431) are parallel to the polysilicon gate layer and cover the drain and source regions of M2 transistor, respectively, and are merged with WWL (432) line layer, which is positioned perpendicular to the polysilicon line layer and passes over the polysilicon line layer along the width of the type A unit cell. Between the M1 and M2 transistors is a free space (440) configured to accommodate the subgroup of S1, M3, S2 transistors of the type C and type D unit cells. Therefore, the size of the free space depends on the size of the accommodated subgroup including S1. M3, S2 transistors of Type C and Type D unit cells.

FIG. 5 shows Type B unit cell structure on an integrated circuit according to a second embodiment of the present invention. Type B unit cell (500) consists of three subgroups. The first subgroup (510) includes S1, M3, and S2 transistors; the second subgroup (520) includes M1 transistor; and, the third subgroup (530) includes M2 transistor.

In the first subgroup (510), S1, M3, and S2 transistors are positioned between CSL and EWL line layers, while no transistors are placed between RWL and CSL line layers. In S2, M3 and S1 transistors, polysilicon gate layers are uniformly distributed along the length of the unit cell.

A drain region of S1 transistor is connected to a bit-line (BL) layer by VIA 1 (511). A polysilicon gate layer on S1 transistor extends through CSL layer and is coupled to RWL layer (Metal 2) by VIA 2 (512). A source region of S1 transistor shares a first common active region (a common diffusion region, 513) with a drain region of M3 transistor. In M3 transistor, the gate region is covered by a polysilicon gate layer. A source region of M3 transistor shares a second common active region (514) with a drain region of S2 transistor. A source region of the S2 transistor is coupled to Metal 1 (shown in blue) by VIA 1 (515), and the coupled Metal 1 is connected to CSL line layer (Metal 2) by VIA 2

(516). A gate region of S2 transistor is covered by a polysilicon gate layer, which is connected to EWL line layer by VIA 2 (517).

M1 transistor of the second subgroup (520) and M2 transistor of the third subgroup (530) are similar to M1 and M2 transistors of the type A unit cell (400) in FIG. 4. A description of these transistors is therefore not repeated here. There is free space (540) between M1 and M2 transistors. In this free space (540), subgroups of type C and D cells are accommodated. As such, the size of the free space depends on the size of the accommodated subgroup including S1, M3, S2 transistors of Type C and Type D unit cells.

Metal 1 layer (521) connects M3 transistor to M1 transistor. Specifically, Metal 1 layer (521) couples the polysilicon gate layer of M3 transistor to the polysilicon gate layer of M1 transistor. Another Metal 1 layer (522) connects M1 and M2 transistors. Specifically, Metal 1 layer (522) couples the polysilicon gate layer of M1 transistor to a polysilicon gate layer coupled to a gate region of M2 transistor. The free space (540) between M1 and M2 transistors accommodates subgroups of S1. M3, and S2 transistors of the type C and D unit cells. Therefore, the free space depends on the size of the type of subgroup transistors to fit in the free space.

FIG. 6 shows Type C unit cell structure on an integrated circuit according to a third embodiment of the present invention. Type C unit cell (600) comprises three subgroups, where the first (610), second (620), and third (630) are closely spaced. The first subgroup (610) includes M1 transistor, the second subgroup (620) includes S2, M3, and S1 transistors, and the third subgroup (630) includes M2 transistor.

M1 transistor of the first subgroup (610) is similar to M1 transistor of the second subgroup (420) in FIG. 4 with one difference. The difference is that, in Type A unit cell (400), one end of the polysilicon gate layer of M1 transistor is connected to the polysilicon gate layer of M3 transistor by a Metal 1 layer (424) and the opposite end of the M1 transistor's polysilicon gate bus is connected to the M2 transistor's polysilicon gate bus by a Metal 1 layer (425). On the other hand, in the type C unit cell, the M1 transistor has a single open end, and the opposite end is connected to M3 and M2 transistors via Metal 1 layer (611).

S2, M3, and S1 transistors of the second subgroup (620) are similar to S2, M3, and S1 transistors in the type A unit cell (400). Similar features are not repeatedly described herein, and essential technical features are as follows. The space (621) between CSL and EWL line is designed to be occupied by S1, M3, and S2 transistors of Type D unit cell (700). Also, when Type A unit cell (400) and Type B unit cell (500) are combined with Type C unit cell (600) in the middle, S2, M3, and S1 transistors of Type C unit cell (600) can occupy the free spaces (440 and 540) between M1 and M2 transistors of Type A and Type B unit cells (400, 500).

M2 transistor of the third subgroup (630) is similar to M2 transistor in the type A unit cell (400), and the similar description is not repeated herein. Along the length of the type C unit cell (600), Metal 1 layer (611) connects M1, M3 and M2 transistors by VIA 1 (612, 622, and 631). Covering the entire polysilicon gate bus of M3 transistor, Metal 1 layer (611) connects the polysilicon gate bus of M3 transistor to (1) a polysilicon gate bus of M1 transistor by VIA 1 (612) and (2) a polysilicon gate bus of M2 transistor by VIA 1 (631).

FIG. 7 shows Type D unit cell structure on an integrated circuit according to a fourth embodiment of the present invention. Type D unit cell (700) consists of three subgroups, the first, second, and third all having a close spacing between them. The first subgroup (710) includes M1 transistor, the second subgroup (720) includes S2, M3, and S1 transistors, and the third subgroup (730) includes M2 transistor. Due to its tightly spaced characteristics, the second subgroup can occupy free spaces (440, 540, 840, and 940) in adjacent unit cells (e.g., Type A, Type B, Type E, and Type F unit cells) when assembled together.

M1 transistor of the first subgroup (710) shares structural similarities with M1 transistor of the type C unit cell (600), and similar descriptions will not be repeated herein.

S1, M3, and S2 transistors of the second subgroup (720) are similar to S1, M3, and S2 transistors of the type B unit cell (500) with one difference.

The difference is that, in the type B unit cell (500), one end of the polysilicon gate layer of M1 transistor is connected to the polysilicon gate layer of M3 transistor by a first Metal 1 layer (521) and the opposite end of the M1 transistor's polysilicon gate bus is connected to the M2 transistor's polysilicon gate bus by a second Metal 1 layer (522). On the other hand, in the type D unit cell (700), the M1 transistor has a single open end, and the opposite end is connected to M3 and M2 transistors via Metal 1 layer (711). In the type D unit cell (700), covering the entire polysilicon gate layer on the gate region of M3 transistor, Metal 1 layer (711) connects the polysilicon gate layer of M3 transistor to (1) a polysilicon gate layer of M1 transistor by a first VIA 1 (712) and (2) a polysilicon gate layer of M2 transistor by a second VIA 1 (731).

M2 transistor of the type D unit cell (700) shares structural similarities with M2 transistor in the type C unit cell (600), and similar descriptions will not be repeated herein.

FIG. 8 shows Type E unit cell structure on an integrated circuit according to the fifth embodiment of the present invention. Type E unit cell (800) consist of three subgroups, with the free space (840) between the first group (810) and second subgroup (820), while the second and third subgroups are closely spaced. The first subgroup (810) includes M1 transistor, the second subgroup (820) includes M2 transistor, and the third subgroup (830) includes S2, M3, and S1 transistors.

M1 and M2 transistors of the type E unit cell (800) are similar to M1 and M2 transistors of the type A unit cell (400), so similar descriptions will not be repeated herein. In Type E unit cell, the free space (840) between M1 and M2 transistors is used to accommodate a subgroup of S1, M3, S2 transistors of the type C and D unit cells (600,700). Hence, the free space depends on the size of the accommodated sub-group of Type C and Type D unit cells (600,700). Additionally, M2 transistor of the type E cell (800) is positioned between M1 transistor of the first subgroup (810) and S2, M3 and S1 transistors of the third subgroup (830), unlike the M1 transistor of the type A unit cell (400).

In the type E unit cell (800), Metal 1 layer (811) connects M1 transistor to M2 transistor. Specifically, Metal 1 layer (811) couples the polysilicon gate layer of M1 transistor to the polysilicon gate layer of M2 transistor. Another Metal 1 layer (821) connects M2 transistor to M3 transistor. Specifically, Metal 1 layer (821) couples the polysilicon gate layer of M2 transistor to a polysilicon gate layer coupled to a gate region of M3 transistor. It should be noted that diverse metal layers can be used for connecting the sub-groups, e.g., Metal 2, Metal 3, or Metal 4, etc., depending on architectural requirements. Furthermore, polysilicon or diverse metal layers can be used to connect those transistors.

In the type E unit cell (800), S2, M3, and S1 transistors are formed on a p-type substrate containing four n-type active regions. Polysilicon gate layers are disposed on the gate regions in the S2, M3 and S1 transistors in parallel to the length of the unit cell and uniformly distributed. Metal 1 layer and CSL line layer (Metal 2 layer) are connected to the S2 transistor's source region by VIA 1 (831) and VIA 2 (832), respectively. Above a gate region of S2 transistor is a polysilicon gate layer that bypasses the CSL line layer (Metal 2) and connects directly to EWL line layer (Metal 2) by VIA 2 (833). A drain region of S2 transistor shares a first common active region (a common diffusion region, 834) with a source region of M3 transistor. The gate region of M3 transistor is covered by a polysilicon gate layer. The drain region of M3 transistor shares a second common active region (a common diffusion region, 835) with a source region of the S1 transistor. S1 transistor has a gate region covered by a polysilicon gate layer connected to RWL line layer (Metal 2), and a drain region connected to the bit line (BL).

CSL and EWL line layers are both parallel to the width of the unit cell (800) and the space (836) between CSL and EWL line will be occupied by the S1, M3 and S2 transistors of the type F unit cell (900) when the unit cells (800, 900) are combined.

FIG. 9 shows Type F unit cell structure on an integrated circuit according to a sixth embodiment of the present invention. Type F unit cell (900) consist of three subgroups, with the free space (940) between the first and second subgroups (910, 920), while the second and third subgroups (920,930) are closely spaced. The first subgroup (910) includes M1 transistor, the second subgroup (920) includes M2 transistor, and the third subgroup (930) includes S2, M3, and S1 transistors.

M1 and M2 transistors of the type F unit cell (900) are similar to M1 and M2 transistors in type E unit cell (800), so similar descriptions will not be repeated herein. In the type F unit cell (900), a free space (940) between M1 and M2 transistors is used to accommodate the second subgroup (620) of the type C unit cell (600) and the second subgroup (720) of the type D unit cell (700). Thus, the free space depends on the size of the accommodated subgroups which are the groups of S1, M3, S2 transistors (620 and 720) of the type C and D unit cells. Similar to type E unit cell (800), M2 transistor of the type F unit cell (900) is positioned between the first subgroup (910) and the third subgroup (930).

In the third subgroup (930), no transistors are present between RWL and CSL line layers, and S1, M3, and S2 transistors are arranged between CSL and EWL line layers. The space (931) between RWL and CSL line will be occupied by the S1. M3 and S2 transistors of the type-E unit cell (800) when the unit cells (800.900) are combined. Polysilicon gate layers (shown in red color) are disposed on the gate regions in S2, M3 and S1 transistors in parallel to the length of the unit cell and uniformly distributed. A drain region of S1 transistor is connected to a bit-line (BL) layer by VIA 1 (932). Polysilicon gate layer (shown in red color) above S1 transistor is long enough to bypass CSL line layer and connect directly to RWL line layer (Metal 2). A source region of S1 transistor shares a first common active region (a common diffusion region, 933) with a drain region of M3 transistor. In M3 transistor, the gate region is covered by a polysilicon gate layer. A source region of M3 transistor shares a second common active region (934) with a drain region of S2 transistor. A source region of S2 transistor is coupled to Metal 1 (shown in blue) and CSL line layer (Metal 2) by VIA 1 (935) and VIA 2 (936), respectively. A gate region of S2 transistor is covered by a polysilicon gate layer (shown in red color), which is connected to EWL line layer (Metal 2) disposed above the polysilicon gate.

FIG. 10 is a plan view of a layout of the array of A and C type unit cells according to one embodiment of the present invention. The proposed cell layout combination of unit cells A and C (A-C) results in the following spatial effects.

(1) M1 and M2 transistors of type A unit cell (400) and M1 and M2 transistors of type C unit cell (600) are coupled, respectively, so that the length of the coupled transistors is equal to the length of each transistor before the coupling.

(2) Two active regions of the type A's M1 and M2 transistors, which are adjacent to the type C unit cell, and two active regions of Type C's M1 and M2 transistors, which are adjacent to the type C unit cell, are merged together into two common active regions (1010 and 1020). As a result, the combined width (Wpa) of the two-unit cells (A-C) is much smaller than the sum of their individual widths (2Wtu).

(3) When the type A and C unit cells (400,600) are coupled, S1, M3, and S1 transistors (620) of the type C unit cell (600) are accommodated in the free space (440) between M1 and M2 transistors in the type A unit cell (400), so they require less space than if they were outside of this space.

(4) As a result of the effects of (2) and (3), the combination of two-unit cells (A-C) has a much narrower width (Wpa) than the sum of their widths (2Wtu). Additionally, the combination of the unit cells (A-C) has a longer length (Lpa) in order to accommodate the second subgroup of the unit cell of the type C as compared to the length (Ltu) of a traditional unit cell as shown in FIG. 2A.

FIG. 11 shows a plan view of a layout of the array of the types A and C unit cells, with the B type unit cell added. The proposed cell layout combination of unit cells A, C and B (A-C-B) results in the following spatial effects.

(1) Two active regions of Type C's M1 and M2 transistors, which are adjacent to the type B unit cell, and two active regions of Type B's M1 and M2 transistors, which are adjacent to the type C unit cell, are merged together into two common active regions (1110 and 1120).

(2) S1 transistor gate region in the type A and S1 transistor gate region of the type B unit cell are merged into a common gate region (1130), so less space is needed than if the both S1 transistors of the types A and B had their own separate gate region.

(3) Active regions (1140) for S1 transistors of the type B unit cell are allocated just below active regions (418) for S1 transistors of the type A unit cell. However, if the S1 transistors are located side-by-side, additional space is needed to arrange the active region of the S1 transistor.

(4) S2, M3, and S1 transistors (620) of the type C unit cell, which are already located in the free space (440) between M1 and M2 transistors of the type A unit cell, become located in the free space (540) between M1 and M2 transistors of the type B unit cell. As a result, these transistors occupy less space than when they were located outside this space in the type A.

(5) As a result of the effects of (1), (2), (3), and (4) the combination of three-unit cells (A-C-B) has a narrower width (Wpa) than the sum of their traditional widths (3Wtu). Additionally, the combination of the unit cells (A-C-B) has a longer length (Lpa) in order to accommodate the second subgroup of the unit cell of the type C as compared to the length (Ltu) of a traditional unit cell as shown in FIG. 2A.

In FIG. 12, a third array of the types A. C. and B unit cells, with the D type unit cell added. The proposed cell layout combination of unit cells A, C, B and D (A-C-B-D) results in the following spatial effects.

(1) Two active regions of M1 and M2 transistors of the type B unit cell adjacent to the type D unit cell and two active regions of M1 and M2 transistors of the type D unit cell adjacent to the type B unit cell are merged together into two common active regions (1210 and 1220) where one (1210) is shared by the type B's M1 transistor and the type D's M1 transistor and the other (1220) is shared by the type B's M2 transistor and the type D's M2 transistor.

(2) S1, M3, and S2 transistors (1230) of the type D unit cell are located in the free space (440, 540) between M1 and M2 transistors of the type A and B, so they require less space than if they were outside of this area.

(3) The S1 transistor gate region of the type C unit cell and S1 transistor gate region of the type D unit cell are merged into a common gate region (1240), so less space is needed than if the both S1 transistors of the types C and D had their own separate gate region.

(4) As a result of the effects of (1), (2) and (3), the combination of four-unit cells (A-C-B-D) has a narrower width (Wpa) than the sum of their traditional widths (4Wtu). Additionally, the combination of the unit cells (A-C-B-D) has a longer length (Lpa) in order to accommodate the second subgroup of the type C and D unit cell as compared to the length (Ltu) of a traditional unit cell as shown in FIG. 2A.

FIG. 13A shows one embodiment of a unit cell in FIG. 4 with rearranged Metal 2 lines. FIG. 13A shows that Metal 2 lines in the third subgroup (410) of the type A unit cell can be rearranged into CSL-RWL-EWL. Consequently, when the type A unit cell is combined with other types of unit cells having a third subgroup comparable to that of the type A unit cell, and when Metal 2 lines of the type A unit cell is rearranged, the other types of unit cells will also have changed Metal 2 lines. However, this rearranged Metal 2 lines do not affect VIA 2 connections between Metal 2 lines and S2, M3, and S1 transistors in the third subgroup (410).

FIG. 13B shows one embodiment of a unit cell in FIG. 5 with rearranged Metal 2 lines. The Metal 2 lines in the third subgroup (510) of the type B unit cell are rearranged into CSL-RWL-EWL. Type B unit cell with rearranged metal 2 lines is to be coupled with type A unit cell with rearranged metal 2 lines in FIG. 13A. However, like the type A unit cell with rearranged Metal 2 lines in FIG. 13A, these rearranged Metal 2 lines do not affect VIA 2 connections between those lines and S2, M3, and S1 transistors in the third subgroup (510).

FIG. 14A shows another embodiment of a unit cell in FIG. 4 with rearranged Metal 2 lines. FIG. 14A shows that Metal 2 lines in the third subgroup (410) of the type A unit cell can be rearranged into RWL-EWL-CSL. Consequently, when the type A unit cell is combined with other types of unit cells having a third memory unit comparable to that of the type A unit cell, and when Metal 2 lines of the type A unit cell is rearranged, the other types of unit cells will also have changed Metal 2 lines. However, this rearranged Metal 2 lines do not affect VIA 2 connections between Metal 2 lines and S2, M3, and S1 transistors in the third subgroup (410).

FIG. 14B shows one embodiment of a unit cell in FIG. 5 with rearranged Metal 2 lines. The Metal 2 lines in the third subgroup (510) of the type B unit cell are rearranged into RWL-EWL-CSL. Type B unit cell with rearranged metal 2 lines is to be coupled with type A unit cell with rearranged metal 2 lines in FIG. 14A. However, like the type A unit cell with rearranged Metal 2 lines in FIG. 14A, these rearranged Metal 2 lines do not affect VIA 2 connections between those lines and S2, M3, and S1 transistors in the third subgroup (510). It is also possible to rearrange six combinations of three Metal 2 lines in a single unit cell without affecting the connectivity between the Metal 2 lines and Via 2 lines.

FIGS. 15 through 17 are plan views of another exemplary arrays according to one embodiment of the present invention. The present invention involves setting the distance between M1 and M2 transistors, leaving an empty space corresponding to the distance, and letting a laterally adjacent unit occupy it. Additionally, when unit cells with transistors S1, M3, and S2 are coupled together, one of the transistors in the adjacent unit cells can share the same gate region.

FIG. 15 shows a first layout of the combination of the types C and E unit cells. This proposed cell layout (C-E) enables compact cell arrays with the following spatial effects.

(1) Two active regions of M1 and M2 transistors of the type C unit cell, which are adjacent to an end side the type E, and two active regions of M1 and M2 transistors in the type E, which are adjacent to an end side of the type C, are merged together into two common active regions (1510 and 1520) where one (1510) is shared by the type C's M1 transistor and the type E's M1 transistor and the other (1520) is shared by the type C's M2 transistor and the type E's M2 transistor. In combining the active regions of M1 and M2, less width is needed than if those four transistors had separate active regions.

(2) The S2, M3, and S1 transistors (620) of the type C unit cell are accommodated between the type E's M1 and M2 transistors (840), therefore they occupy less space than when located outside this space.

(3) The type C unit cell does not contain subgroups below the M2 transistor, which correspond to the location (1530) of S2, M3, and S1 transistors of the type E unit cell. Therefore, even when type C and type E unit cells are combined, the combined S2, M3 and S1 transistors of the type E unit cell do not require additional space, and their occupying space remains unchanged.

(4) As a result of the effects of (1), (2) and (3), the combined two-unit cells (C-E) has a narrower width (Wpa) than the sum of their traditional widths (2Wtu). Additionally, the combination of the unit cells (C-E) has a longer length (Lpa) in order to accommodate the second subgroup of the type C and D unit cell as compared to the length (Ltu) of a traditional unit cell as shown in FIG. 2A.

FIG. 16 shows a second array of the types C and E unit cells, with D type unit cell added. This proposed cell layout (C-E-D) enables compact cell arrays with the following spatial effects.

(1) Two active regions of M1 and M2 transistors in the type E unit cell, which are adjacent to an end side the type D, and two active regions of M1 and M2 transistors in the type D, which are adjacent to an end side of the type E, are merged together into two common active regions (1610 and 1620) where one (1610) is shared by the type E's M1 transistor and the type D's M1 transistor and the other (1620) by the type E's M2 transistor and the type D's M2 transistor. By combining the active regions of M1 and M2, less space is needed than if those four transistors had their own independent active regions.

(2) The S1 transistor gate region of the type C unit cell and S1 transistor gate region of the type D unit cell are merged into a common gate region (1630), so less space is needed than if both S1 transistors in the types C and D had their own separate gate region.

(3) Active regions (1640) for S1 transistor of the type D unit cell are allocated just below active regions (1650) for S1 transistor of the type C. This eliminates the need for additional space for the active regions of the S1 transistor.

(4) S1, M3, and S2 transistors (1660) of the type D unit cell are accommodated in the free space (840) between M1 and M2 transistors in the type E, so they require less space than if they were outside of this area.

(5) As a result of the effects of (1), (2), (3) and (4), the combined three-unit cells (C-E-D) has a much narrower width (Wpa) than the sum of their traditional widths (3Wtu). Additionally, the combination of the unit cells (C-E) has a longer length (Lpa) in order to accommodate the second subgroup of the type C and D unit cell as compared to the length (Ltu) of a traditional unit cell as shown in FIG. 2A.

FIG. 17 shows a unit cell array according to one embodiment of the present invention. In FIG. 17 a third cell array of the types C. E. and D unit cells, with F type unit cell added. This proposed cell layout (C-E-D-F) enables compact cell arrays with the following spatial effects.

(1) Two active regions of M1 and M2 transistors in the type D unit cell, which are adjacent to an end side the type F. and two active regions of M1 and M2 transistors in the type F, which are adjacent to an end side of the type D, are merged together into two common active regions (1710 and 1720) where one (1710) is shared by the type D's M1 transistor and the type F's M1 transistor and the other (1720) is shared by the type D's M2 transistor and the type F's M2 transistor. By combining the active regions of M1 and M2, less space is needed than if those four transistors had their own independent active regions.

(2) As S2. M3, and S1 transistors (1660) of the type D unit cell are accommodated in the free space (840, 940) between M1 and M2 transistors in the type E and F, they occupy less space than when they were located outside.

(3) Active regions (1730) for S1 transistor of the type F are allocated just below active regions (836) for S1 transistor of the type E. This eliminates the need for additional space for the active regions of the S1 transistor.

(4) S1 transistor gate region in the type E and S1 transistor gate region in the type F are merged into a common gate region (1740), so less space is needed than if the both S1 transistors in the types E and F had their own separate gate region. Like the array with the combination of types A-C-B-D unit cells, this proposed array with combination of types C-E-D-F unit cells occupies less space than the traditional array with four-unit cell arrangement.

(5) As a result of the effects of (1), (2), (3) and (4), the combined four-unit cells (C-E-D-F) occupy a narrower space (Wpa) than the sum of their traditional widths (4Wtu). Additionally, the free space between M1 and M2 transistors of the one-unit cell is increased so that the subgroup of the other unit cell can be accommodated when they are coupled together. As a result, the combined unit cells have a longer layout than typical unit cell combinations, but a much narrower width.

FIG. 18 shows exemplary modified type A unit cell structures according to the present invention. As shown in FIG. 18, the type A unit cell can be modified by mirroring the arrangement of transistors S2-M3-S1 (410), which is the first subgroup of the type A unit cell, into an arrangement of transistors S1-M3-S2 (1810). For pairing with the modified type A unit cell, a type B unit cell can be modified by mirroring the order of S1-M3-S2 (510), which is the first subgroup of the type B unit cell, into an order of transistors S2-M3-S1 according to one embodiment of the present invention. This rearrangement of the type B cell is to share a gate region of S2 with an adjacent one of the rearranged transistors of the type A cell.

The type A unit cell also can be modified in a way that Metal 1 layer (424), which connects M1 and M3 transistors, is removed by combining the two separate polygate buses into a single polygate bus (1820), while other subgroup transistors remain the same.

FIG. 19 shows exemplary modified type C unit cell structures according to the present invention. The type C unit cell can be modified by mirroring the arrangement of transistors S2-M3-S1 (620), which is the second subgroup of the type C unit cell, into an arrangement of transistors S1-M3-S2 (1910). For pairing with the modified type C unit cell, a type D unit cell can be modified by mirroring the order of S1-M3-S2 (720), which is the second subgroup of the type D unit cell, into an order of transistors S2-M3-S1 according to one embodiment of the present invention. This rearrangement of the type D cell is to share a gate region of S2 with an adjacent one of the rearranged transistors of the type C cell.

The type C unit cell also can be modified such that Metal 1 layer (611) for connecting M1, M3 and M2 transistors is removed by combining the three separate polygate buses into a single polygate bus (1920), while other subgroup transistors remain the same.

While specific embodiments have been described above with reference to the disclosed embodiments and examples, such embodiments are only illustrative and do not limit the scope of the invention. Changes and modifications can be made in accordance with ordinary skill in the art without departing from the invention in its broader aspects as defined in the following claims.

All publications, patents, and patent documents are incorporated by reference herein, as though individually incorporated by reference. No limitations inconsistent with this disclosure are to be understood therefrom. The invention has been described with reference to various specific and preferred embodiments and techniques. However, it should be understood that many variations and modifications may be made while remaining within the spirit and scope of the invention.

What is claimed is:

1. A non-volatile memory device comprising:

a substrate having a plurality of n-wells, each n-well including a plurality of diffusion regions, wherein said diffusion regions are separated from each other by an isolation region of the substrate;

a first unit cell extending along a longitudinal axis, said first unit cell comprising:

a first memory unit having a first P-MOS transistor disposed on a first n-well on the substrate;

a second memory unit having a second P-MOS transistor disposed in a second n-well on the substrate, a third memory unit having three N-MOS transistors disposed on the substrate and connected in series and arranged parallel to a length of a longitudinal axis of the first unit cell; and, at least one connection lines coupling a gate of one of the three N-MOS transistors to gates of the first and second P-MOS transistors, wherein the three N-MOS transistors in series consist of a first N-MOS transistor sharing a first active region with a second N-MOS transistor, and the second N-MOS transistor sharing a second active region with a third N-MOS transistor; and a second unit cell, disposed laterally adjacent to the first unit cell, comprising three memory units including a third P-MOS transistor and a fourth P-MOS transistor, wherein the third and fourth P-MOS transistors are substantially identical to the first and second P-MOS transistors, respectively, and laterally overlap at least a portion of the first and second P-MOS transistors along a direction perpendicular to the longitudinal axis, wherein, in the first unit cell, the first P-MOS transistor has source and drain regions connected to a first word line parallel to a width of the first unit cell, whereas the second P-MOS transistor has source and drain regions connected to a second word line parallel to the width of the first unit cell, and each of the first and second word lines is either a program word line or a write word line.

2. The non-volatile memory device according to claim 1, wherein metal layers or polysilicon layers are used for the connection line.

3. The non-volatile memory device according to claim 1, wherein the third memory unit of the first unit cell further comprises (1) a group of first metal lines arranged parallel to the length of the first unit cell and (2) a group of second metal lines arranged parallel to the width of the first unit cell.

4. The non-volatile memory device according to claim 3, wherein one of the group of first metal lines is connected to an active region at one end of the three transistors in series, while the other is connected to an active region at the opposite end of the three transistors.

5. The non-volatile memory device according to claim 3, wherein the group of second metal lines include three parallel metal lines, which are separated at regular intervals, extending along a width of the first unit cell such that at least a portion of the three N-MOS transistors is positioned between a first and second one of the group of second metal lines, whereas a third unit cell has three N-MOS transistors positioned in an interval between the second and third one of the group of second metal lines.

6. The non-volatile memory device according to claim 5, wherein the third memory unit of the first unit cell is combined to a third memory unit of the third unit cell, wherein the third unit cell overlaps at least partially with the second unit cell and a fourth unit cell laterally adjacent to the third unit cell on an opposite side from where the second unit cell is located.

7. The non-volatile memory device according to claim 6, wherein the third unit cell includes three memory units, including first and second memory units that are identical to the first and second memory units of the first unit cell and a third memory unit with a mirrored arrangement of the N-MOS transistors in the first unit cell.

8. The non-volatile memory device according to claim 7, wherein the third unit cell further includes (1) a group of first metal lines arranged parallel to the length of the unit cell with the same structure as the group of first metal lines of the first unit cell and (2) a group of second metal lines arranged parallel to the width of the unit cell with intervals identical to the intervals of the group of second metal lines of the first unit cell.

9. The non-volatile memory device according to claim 7, wherein a distance between the first and second memory units in the third unit cell is equal to the distance between the first and second memory units of the first unit cell.

10. The non-volatile memory device according to claim 6, wherein the fourth unit cell includes first and second memory units identical to the first and second memory units in the second unit cell.

11. The non-volatile memory device according to claim 10, wherein the third memory unit includes (1) a group of first metal lines arranged parallel to the length of the unit cell with the same structure as the group of first metal lines of the second unit cell and (2) a group of second metal lines arranged parallel to the width of the unit cell with intervals identical to the intervals of the group of second metal lines of the second unit cell.

12. The non-volatile memory device according to claim 10, wherein the third memory unit is configured with a mirrored arrangement of the N-MOS transistors in the second unit cell, wherein the third memory unit of the second unit cell is combined to a third memory unit of the fourth unit cell.

13. The non-volatile memory device according to claim 1, wherein each of the N-MOS and P-MOS transistors of the first unit cell has a gate region that is connected to a polysilicon layer.

14. The non-volatile memory device according to claim 13, wherein one of the N-MOS transistors has a gate region with polysilicon layer connected through a metal line or a polysilicon layer to the gate region of the first P-MOS transistor and the gate region of the second P-MOS transistor.

15. The non-volatile memory device according to claim 1, wherein the first unit cell has a space between the first memory unit and the second memory unit, which is long enough to accommodate either (1) a memory unit of the second unit cell laterally adjacent to the first unit cell or (2) the third memory unit of the first unit cell.

16. The non-volatile memory device according to claim 1, wherein a distance between the third and fourth P-MOS transistors in the second unit cell is equal to the distance between the first and second P-MOS transistors in the first unit cell such that common active regions are formed when active regions of the first and second PMOS transistors in the first unit cell, which are adjacent to the second unit cell, are combined with active regions of first and second PMOS transistors in the second unit cell, which are adjacent to the first unit cell.

17. The non-volatile memory device according to claim 16, wherein the second unit cell includes a third memory unit, which comprises three N-MOS transistors having a similar structure as the first unit cell.

18. The non-volatile memory device according to claim 17, wherein the third memory unit in the second unit cell has a same size with the third memory unit of the first unit cell.

* * * * *